US009292026B2

(12) United States Patent
Bhattad

(10) Patent No.: US 9,292,026 B2
(45) Date of Patent: Mar. 22, 2016

(54) CIRCUITS AND METHOD FOR CONTROLLING TRANSIENT FAULT CONDITIONS IN A LOW DROPOUT VOLTAGE REGULATOR

(71) Applicant: Dialog Semiconductor GmbH, Kirchheim/Teck-Nabern (DE)

(72) Inventor: Ambreesh Bhattad, Swindon (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 246 days.

(21) Appl. No.: 14/052,838

(22) Filed: Oct. 14, 2013

(65) Prior Publication Data

US 2015/0097534 A1    Apr. 9, 2015

(30) Foreign Application Priority Data

Oct. 7, 2013   (EP) ..................................... 13368039

(51) Int. Cl.
| G05F 1/565 | (2006.01) |
| G05F 1/46 | (2006.01) |
| G05F 1/56 | (2006.01) |
| H03F 3/45 | (2006.01) |

(52) U.S. Cl.
CPC ...... *G05F 1/462* (2013.01); *G05F 1/56* (2013.01); *H03F 3/45183* (2013.01); *H03F 2200/555* (2013.01); *H03F 2203/45314* (2013.01); *H03F 2203/45636* (2013.01); *H03F 2203/45674* (2013.01); *H03F 2203/45676* (2013.01)

(58) Field of Classification Search
CPC ............ G05F 1/565; G05F 1/575; G05F 5/00

USPC .................................. 323/273, 274, 275, 280
See application file for complete search history.

(56) References Cited

U.S. PATENT DOCUMENTS

| 7,030,677 | B2 | 4/2006 | Pannwitz |
| RE42,335 | E | 5/2011 | Man et al. |
| 8,294,441 | B2 | 10/2012 | Gurcan et al. |
| 8,294,442 | B2 | 10/2012 | Zhu |
| 8,378,652 | B2 | 2/2013 | Xie |
| 2006/0022652 | A1 | 2/2006 | Nishimura et al. |
| 2006/0055383 | A1* | 3/2006 | Eberlein ...................... 323/280 |

(Continued)

OTHER PUBLICATIONS

European Search Report 13368039.7-1807 Mailed: Jun. 18, 2014.

(Continued)

*Primary Examiner* — Jeffrey Sterrett
(74) *Attorney, Agent, or Firm* — Saile Ackerman LLC; Stephen B. Ackerman; Billy Knowles

(57) ABSTRACT

An overshoot reduction circuit within a low dropout voltage regulator eliminates an overshoot at an output terminal resulting from a transient fault condition occurring at an input or output terminal. The overshoot reduction circuit monitors to sense if there is a transient fault condition occurring at the input or output terminal and provides a Miller capacitance at the output terminal of a differential amplifier of the low dropout voltage regulator to prevent the output of the differential amplifier from being discharged to ground during the transient. A control loop circuit balances current within an active load of the differential amplifier to clamp the output of the differential amplifier to its normal operating point. When the transient fault condition ends, the output voltage of the differential amplifier is set such that a pass transistor of the low dropout regulator responds quickly to resume the regulation to reduce or eliminate the overshoot.

11 Claims, 14 Drawing Sheets

(56) References Cited

U.S. PATENT DOCUMENTS

| | | |
|---|---|---|
| 2007/0053115 A1 | 3/2007 | Tain et al. |
| 2008/0265856 A1 | 10/2008 | Takada et al. |
| 2011/0156674 A1 | 6/2011 | Lin et al. |
| 2015/0097534 A1* | 4/2015 | Bhattad ............... 323/270 |
| 2015/0130434 A1* | 5/2015 | Jain et al. ............ 323/280 |
| 2015/0185747 A1* | 7/2015 | Liu .................. G05F 1/565 |

OTHER PUBLICATIONS

"Design of Low-Voltage Low-Dropout Regulator with Wide-Band High-PSR Characteristic," by Liang-Guo Shen et al., Solid-State and Integrated Circuit Technology, Oct. 23, 2006, ICSICT 2006, 8th International Conference, pp. 1-3.

* cited by examiner

CIRCUITS AND METHOD FOR CONTROLLING TRANSIENT FAULT CONDITIONS IN A LOW DROPOUT VOLTAGE REGULATOR

TECHNICAL FIELD

This disclosure relates generally to voltage regulator circuits. More particularly, this disclosure relates to low dropout voltage regulators and even more particularly to low dropout voltage regulators that have circuitry that maintains regulation of an output voltage of the low dropout voltage regulator during transient fault conditions.

BACKGROUND

As is known in the art, a voltage regulator is a constant voltage source that adjusts its internal resistance to any occurring changes of load resistance to provide a constant voltage at the regulator output. FIG. 1 is a schematic diagram of a low dropout voltage regulator. The load resistance of the voltage regulator as shown is formed by the parallel combination of the equivalent series resistance $R_{ESR}$ of the load capacitor $C_L$ and the load resistor $R_L$.

In order to regulate the output voltage resulting from any changes is the load resistor $R_L$, the internal resistance of the voltage regulator must be adjusted to maintain the output voltage $V_{OUT}$ at the desired level. To accomplish this, the output voltage is sensed by the voltage divider formed by the series resistors $R_1$ and $R_2$. As is known, the feedback voltage $V_{FB}$ is the product of the output voltage $V_{OUT}$ and the ratio of the resistor $R_2$ and the sum of the series resistors $R_1$ and $R_2$. An error amplifier receives the feedback voltage $V_{FB}$ and compares it with a reference voltage $V_{REF}$. The output voltage of the error amplifier $A_{ERR}$ is an indication of the error between the feedback voltage $V_{FB}$ and the reference voltage $V_{REF}$ that is applied to gate of the PMOS pass transistor $P_{PASS}$. The drain-to-source voltage (Vds) and the drain-to-source current (Ids) determine the equivalent internal resistance of the low dropout voltage regulator. As is known, the drain-to-source voltage (Vds) and the drain-to-source current (Ids) are determined by the transconductance of the PMOS pass transistor $P_{PASS}$ and the gate-to-source voltage (Vgs) of the PMOS pass transistor $P_{PASS}$.

The dropout voltage of the low dropout regulator is normally defined the point at which the drain-to-source voltage (Vds) of the PMOS pass transistor $P_{PASS}$ is not changed when the gate-to-source voltage (Vgs) changes and the PMOS pass transistor $P_{PASS}$ is in saturation.

The size of the PMOS pass transistor $P_{PASS}$ is normally very large to provide the necessary current to the load resistance $R_L$. Further the load capacitance $C_L$ and the miller capacitance of the PMOS pass transistor $P_{PASS}$ create a zero the right hand plane that may cause instability in the error amplifier $A_{ERR}$ and cause oscillation in the output voltage. To alleviate the instabilities, the compensation capacitor $C_{COMP}$ is placed between the gate and the drain of the PMOS pass transistor $P_{PASS}$ to shift the zero sufficiently high in frequency to not cause the instabilities.

In the existing low dropout regulators, a line transient at the input voltage terminal $V_{IN}$ may cause the low dropout regulator to go deep into dropout. When the transient is removed from the input terminal $V_{IN}$, the output of the error amplifier $A_{ERR}$ is at a voltage level such that the PMOS pass transistor $P_{PASS}$ is deep into triode region of operation. This causes a very large overshoot voltage level to occur at the output terminal $V_{OUT}$ and across the load capacitance $C_L$ and the load resistance $R_L$. The very large overshoot voltage level can cause reliability issues for a load device forming the load capacitance $C_L$ and the load resistance $R_L$ being powered by low dropout regulator.

SUMMARY

An object of this disclosure is to provide a circuit that maintains regulation of an output voltage at the output terminal of a low dropout voltage regulator at the removal of transient fault conditions at the input terminal or output terminal of the low dropout voltage regulator.

Another object of this disclosure is to provide a control loop circuit for balancing an active load current in an error amplifier of a low dropout voltage regulator resulting from transient fault conditions occurring at an input terminal or an output terminal of the low dropout voltage regulator.

To accomplish at least one object of this disclosure, a control loop circuit balances an active load current in an error amplifier of a low dropout voltage regulator resulting from a transient fault conditions occurring at an input terminal or an output terminal of the low dropout voltage regulator to minimize or eliminate an overshoot at an output terminal of a low dropout voltage regulator resulting from the transient fault conditions occurring at an input terminal or an output terminal of the low dropout voltage regulator. The control loop circuit has a transient fault sense circuit to determine that the low dropout voltage regulator is responding to input or output transient faults. A local control loop is connected to the output terminal of the sense circuit to receive a transient fault indicator signal communicating that the low dropout voltage regulator is responding to input or output transient faults. If the transient fault indicator signal shows that the low dropout voltage regulator is responding to input or output transient faults, the local control loop clamps an output voltage level of a differential amplifier of an error amplifier close to the operating point of the error amplifier. The local control loop clamps the output voltage level by balancing the currents in an active load of the differential amplifier, while a pass transistor is in the deep triode region of operation. When the transient voltage present at the input terminal or a transient load current present at the output terminal of the low dropout voltage regulator is ending, the voltage level present at the input terminal is returned to its normal operating voltage without any overshoot.

The transient fault sense circuit has an input terminal connected to an output driver of the low dropout voltage regulator to indicate that the low dropout voltage regulator is responding to input or output transient faults. The transient fault sense circuit has a first transistor of a first conductivity type (PMOS) having a source terminal connected to a sense point within the output driver of the low dropout voltage regulator. A gate of the first transistor of the first conductivity type is connected to a reference voltage source such that when the sense point increases sufficiently large the first transistor of the first conductivity type is conducting. The conducting of the first transistor of the first conductivity type indicates that the voltage level at the output of low dropout voltage regulator is below the required regulated voltage and the low dropout voltage regulator is responding to input or output transient faults. The drain of the first transistor of the first conductivity type is connected form the output terminal of the transient fault sense circuit and is connected to the local control loop to provide the transient fault indicator signal to the local control loop. The output terminal of the local control loop is connected to the output terminal of the differential amplifier. The drain of the first transistor of the first conductivity type is connected to a gate and drain of a first transistor of a second conductivity type (NMOS). The source of the first transistor of the second conductivity type is connected to the ground reference voltage source. The first transistor of the second conductivity type acts as a load transistor of the first transistor of the first conductivity type. The drain of the first transistor of the first conductivity type is further connected to a gate and drain of a second transistor of the second conductivity type and to a first terminal of a constant current sink.

The second terminal of the constant current sink is connected to the ground reference voltage source. The source of the second transistor of the second conductivity type is connected to the ground reference voltage source. The constant current sink insures that the gates and drains of the first and the second transistor of the second conductivity type are forced to the voltage level of the ground reference voltage source when the first transistor of the first conductivity type is not conducting.

The drain of the second transistor of the second conductivity type is connected to a first terminal of a constant current source. The second terminal of the constant current source is connected to input terminal of the low dropout voltage regulator. The common connection between the constant current source and the drain of the second transistor of the second conductivity type is connected to the output terminal of the transient fault sense circuit and thus to the input of the local control loop. The input of the local control loop is connected to a gate of a second transistor of the first conductivity type within the local control loop. The drain of second transistor of the first conductivity type is connected to output terminal of the differential amplifier. The source of the second transistor of the first conductivity type is connected to the drain of a third transistor of first conductivity type. The source of the third transistor of the first conductivity type is connected to a biasing current source of the differential amplifier of the error amplifier of the low dropout voltage regulator. The gate of the third transistor of the first conductivity type is connected to receive a feedback voltage that is scaled from the voltage level of the output terminal of the low dropout voltage regulator.

When a transient fault condition occurs at an input terminal or an output terminal of the low dropout voltage regulator, the output of the differential amplifier decreases and the voltage at the source of the first transistor of the conductivity type increases. The first transistor of the first conductivity type begins to conduct and the second transistor of the second conductivity type begins to conduct causing the voltage at the gate of the second transistor of the first conductivity type to decrease dramatically as the second transistor of the second conductivity type begins to saturate. The second transistor of the first conductivity type is conducting. The voltage difference between the feedback voltage level and the voltage level of the input terminal of the low dropout voltage regulator causes the third transistor of the first conductivity type to conduct also. This causes the output voltage level of the differential amplifier to be clamped close to is operating level rather than ground by balancing the current in the active load of the differential amplifier. This allows the low dropout voltage regulator to assume regulation without any overshoot output voltage when the transient at the input terminal of the low dropout voltage regulator is removed.

In various embodiments, at least one object of this disclosure is accomplished by a low dropout voltage regulator that includes a control loop circuit that balances an active load current in an error amplifier of a low dropout voltage regulator resulting from a transient fault condition occurs at an input terminal or an output terminal of the low dropout voltage regulator to minimize or eliminate an overshoot at an output terminal of a low dropout voltage regulator resulting from the transient fault conditions occurring at an input terminal or an output terminal of the low dropout voltage regulator. The control loop circuit has a transient fault sense circuit to determine that a transient fault condition. A local control loop is connected to the output terminal sense circuit to receive a transient fault indicator signal communicating the low dropout voltage regulator has lost regulation and the voltage at the output of the low dropout voltage regulator is lower than the required regulated voltage. If the transient fault indicator signal shows that the low dropout voltage regulator is in responding to input or output transient faults, the local control loop balances the current in the active loads of the differential amplifier and clamps an output of a differential amplifier of the error amplifier close to the operating point of the differential amplifier. When the transient voltage present at the input terminal or the transient current present at the output terminal of the low dropout voltage regulator is ending, the voltage level present at the input terminal is returned to its normal operating voltage with no overshoot.

In various embodiments, at least one object of this disclosure is accomplished by a low dropout voltage regulator that includes a local control loop connected to provide a balancing current to an active load of a differential amplifier within the low dropout voltage regulator when a transient fault condition occurs at an input terminal or an output terminal the low dropout voltage regulator. The balancing current in the active load of the differential amplifier clamps an output voltage level of the differential amplifier near an operational voltage level when a pass transistor of the low dropout voltage regulator is deep triode region of operation or the low dropout voltage regulator is in current limit condition or any other fault condition that forces the output voltage of the low dropout voltage regulator to be lower than the required regulated voltage. Maintaining the output voltage level near the operational voltage level insures fast response in controlling the gate of the pass transistor to minimize overshoot when the input terminal of the low dropout voltage regulator is ending and the voltage level present at the input terminal is returned to its normal operating voltage.

The local control loop has a clamping transistor of a first conductivity type, a diode connected transistor of the first conductivity type, and a biasing transistor of the second conductivity type. The clamping transistor has a source connected to a driver circuit of the low dropout voltage regulator and a drain connected to an output of the differential amplifier of the low dropout voltage regulator to provide the balancing current to the active load of the differential amplifier. The balancing current forces an output voltage at an output terminal of the differential amplifier to be at approximately \ the operating voltage level of the differential amplifier. The diode connected transistor of the first conductivity type has a source connected to a pass supply voltage source, a gate and drain connected to a gate of the clamping transistor. The biasing transistor of a second conductivity type has a drain connected to a drain of the diode connected transistor and the gate of the clamping transistor. The gate of the biasing transistor is connected to receive a biasing voltage level and a source of the biasing transistor is connected to ground reference voltage source.

A voltage developed by the diode connected transistor and the biasing transistor at the gate of the clamping transistor is less than the voltage level at the source of the clamping transistor. When the pass supply voltage source has a transient voltage, the clamping transistor is turned on to provide the balancing current to the active load of the differential amplifier. The balancing current sets the output voltage at an output terminal of the differential amplifier is at approximately at the operating voltage level of the differential amplifier to quickly control a gate of a pass transistor of the low dropout regulator to minimize an overshoot of an output voltage of the low dropout voltage regulator.

In various embodiments, at least one object of this disclosure is accomplished by a method performed by an overshoot reduction circuit within a low dropout voltage regulator that begins at the activation of the low dropout voltage regulator. An input voltage at the input terminal of the low dropout voltage regulator is monitored to sense if there is a transient fault condition occurring at an input terminal or an output terminal. When the transient fault condition is present at the input terminal or the output terminal of the low dropout voltage regulator, the overshoot reduction circuit balances a current within an active load of a differential amplifier of an error amplifier of the low dropout voltage regulator to clamp the output of the differential amplifier to its normal operating point. When the transient fault condition ends, the output voltage of the error amplifier is set such that the pass transistor responds quickly to resume the regulation and the overshoot is reduced or eliminated and the sensing of the input voltage level is sensed for the presence of the transient. The current balancing ensures that when the low dropout voltage regulator is responding to input or output transient faults, the plate of a Miller capacitance at the output terminal of the differential amplifier is not discharged to the ground reference voltage level.

DETAILED DESCRIPTION

Figure 1:
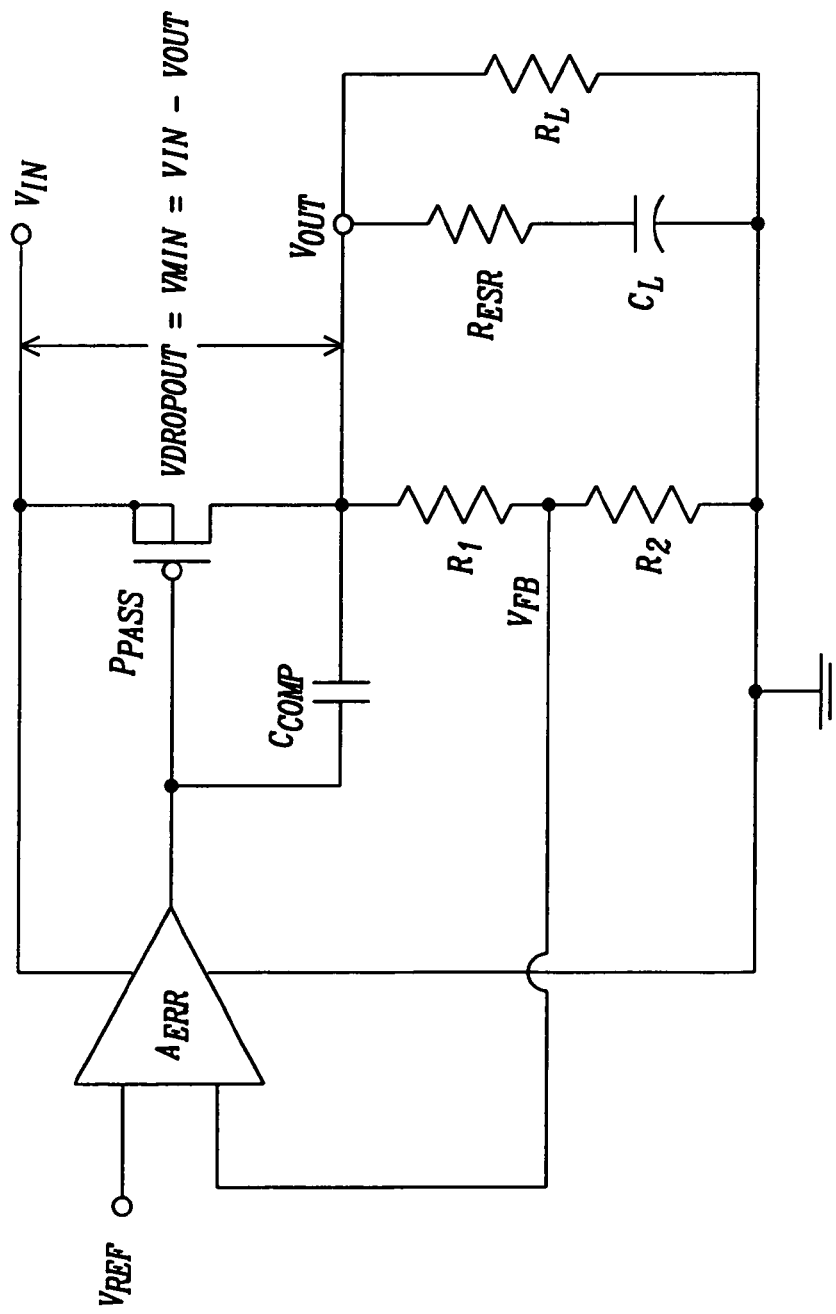
FIG. 1 is a schematic diagram of a low dropout voltage regulator.
Figure 2:
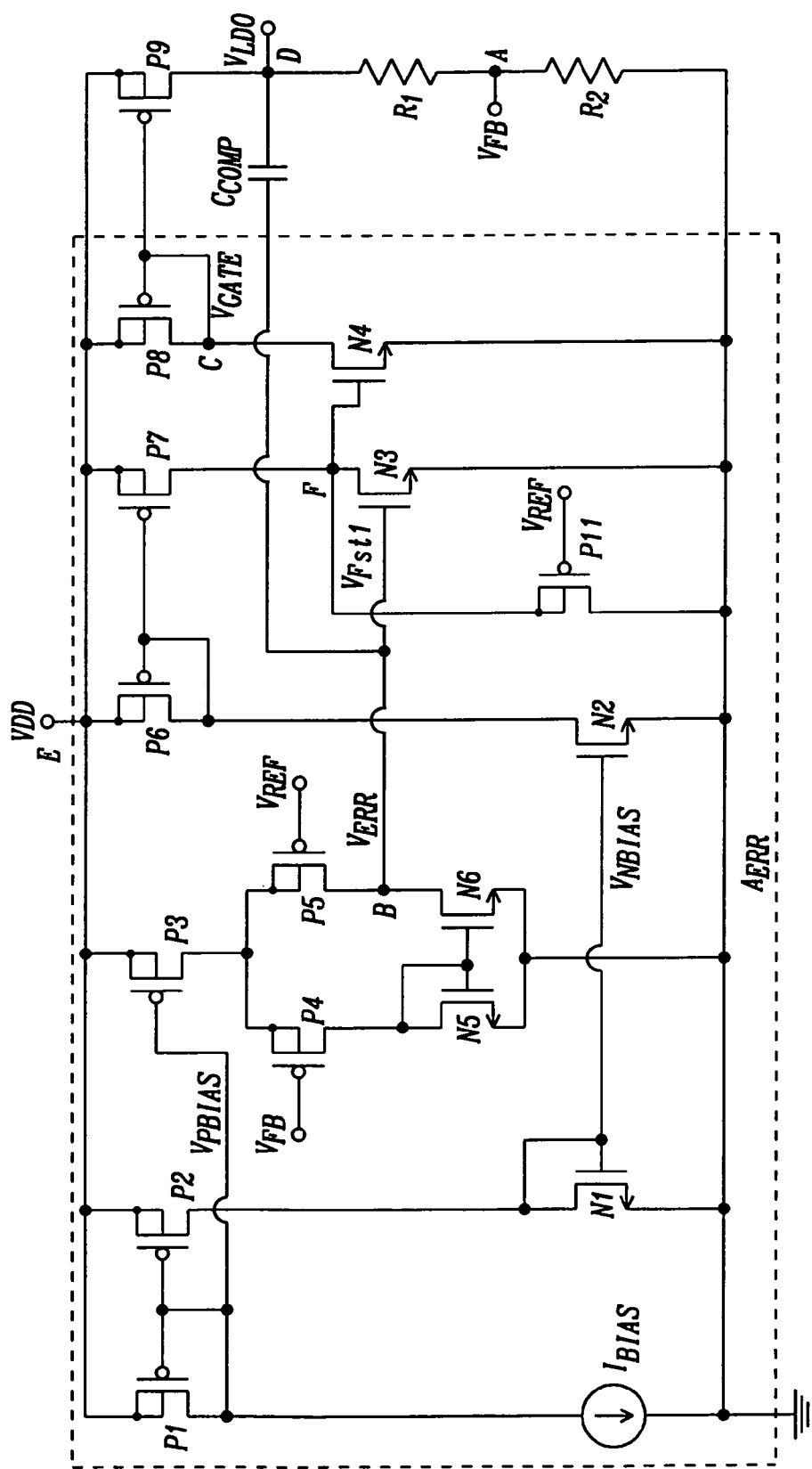
FIG. 2 is a schematic diagram of a low dropout voltage regulator of FIG. 1 showing a detailed schematic of the error amplifier.
Figure 3A:
FIGS. 3a-3e are plots of voltage levels at various connection points within the low dropout voltage regulator of FIG. 2 during a voltage transient fault condition of the input voltage.
Figure 3B:
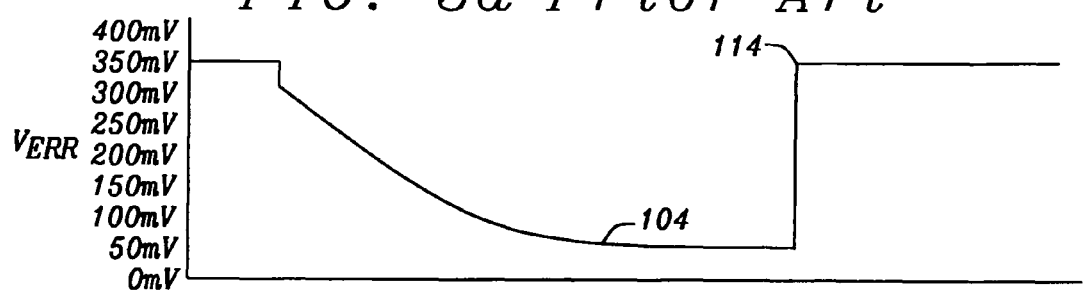
Figure 3C:
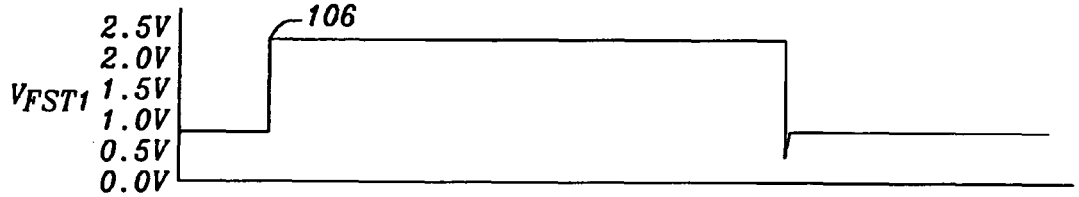
Figure 3D:
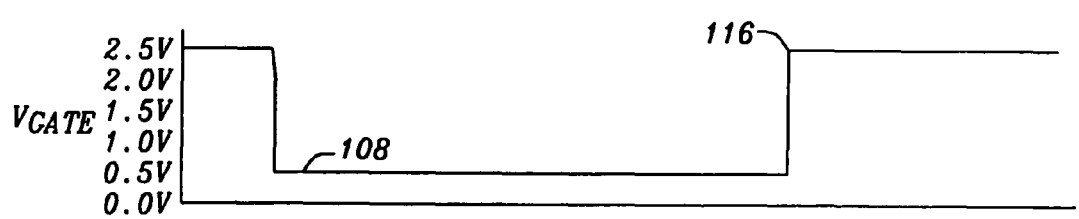
Figure 3E:

FIG. 2 is a schematic diagram of the low dropout voltage regulator of FIG. 1 showing a detailed schematic of the error amplifier $A_{ERR}$. The error amplifier $A_{ERR}$ has a differential amplifier formed of the differential pair of PMOS transistors P4 and P5. The PMOS transistor P3 forms a biasing current source for the differential amplifier and the NMOS transistors N5 and N6 form the load devices for the differential pair of PMOS transistors P4 and P5. The PMOS transistors P1 and P2, a biasing current source $I_{BIAS}$, and the NMOS transistor N1 form a voltage biasing generator that generates the P-type biasing voltage $V_{PBIAS}$ and the N-type biasing voltage $V_{NBIAS}$. The P-type biasing voltage $V_{PBIAS}$ is applied to the gate of the PMOS transistor P3 to bias the PMOS transistor P3 to for generating the biasing current for the differential pair of transistors P4 and P5.

The drains of the PMOS transistor P5 and the NMOS transistor N6 are connected to form the output terminal of the differential pair of the error amplifier $A_{ERR}$. The feedback voltage $V_{FB}$ that is developed at the common connection A of the series resistors $R_1$ and $R_2$ is applied to the gate of the PMOS transistor P4. A reference voltage $V_{REF}$ is applied to the gate of the PMOS transistor P5. The difference in the feedback voltage $V_{FB}$ and the reference voltage $V_{REF}$ is developed at the output terminal B of the differential pair of transistors P4 and P5 of the error amplifier $A_{ERR}$ as the error voltage $V_{ERR}$. The drain of the PMOS transistor P4 is connected to the drain and gate of the NMOS transistor N5 and the gate of the NMOS transistor N6. The sources of the NMOS transistors N5 and N6 are connected to the ground reference voltage source.

The error voltage $V_{ERR}$ is applied from the output terminal B of the differential pair of transistors P4 and P5 to the gate of the NMOS transistor N3. The NMOS transistors N3 and N4 are the output driver for the error amplifier $A_{ERR}$. The PMOS transistor P7 forms the load transistor for the NMOS transistor N3. The diode connected PMOS transistor P6 and the NMOS transistor N2 form the biasing circuit for the PMOS load transistor P7. The N-type biasing voltage $V_{NBIAS}$ from the biasing voltage generator is applied to the gate of the NMOS transistor N2. The sources of the PMOS transistors P6 and P7 are connected to the input voltage terminal E of the low dropout voltage regulator to receive the input voltage level VDD.

The NMOS transistor N3 and the PMOS transistor P7 form an amplifier stage for amplifying the error voltage $V_{ERR}$ to be applied to the gate of the NMOS transistor N4. The diode connected PMOS transistor P8 is the load transistor for the NMOS transistor N4. The drain of the NMOS transistor N4 is connected to the gate and drain of the PMOS transistor P8. The source of the PMOS transistor P8 connected to the input voltage terminal E of the low dropout voltage regulator to receive the input voltage level VDD. The source of the NMOS transistor N4 is connected to the ground reference voltage source. The common connection of the drain of the NMOS transistor and the gate and drain of the PMOS transistor P8 form the output terminal C of the error amplifier $A_{ERR}$. The PMOS transistor P9 is the pass transistor of the low dropout voltage regulator. The gate of the PMOS transistor P9 is connected to the output terminal of the error amplifier $A_{ERR}$ and thus to the common connection C of the drain of the NMOS transistor N4 and the gate and drain of the PMOS transistor P8 to apply the gating control voltage $V_{GATE}$ to the PMOS transistor P9. The source of the PMOS transistor P9 connected to the input voltage terminal E of the low dropout voltage regulator to receive the input voltage level VDD. The drain of the PMOS transistor P9 is connected to the to the output terminal D of the low dropout voltage regulator to provide the output voltage level $V_{LDO}$ to the load capacitor $C_L$ and the load resistor $R_L$ of FIG. 1.

As in FIG. 1, the drain of the PMOS pass transistor P9 is connected to the top terminal of the series resistors $R_1$ and $R_2$. Also, as in FIG. 1, the compensation capacitor $C_{COMP}$ is connected from the common connection D of the series resistors $R_1$ and $R_2$ and the PMOS pass transistor P9 and the output terminal B of the error amplifier $A_{ERR}$. As is similar to the description in FIG. 1, the compensation capacitor $C_{COMP}$ is placed between output terminal B of the differential amplifier and the drain of the PMOS pass transistor Pg and the output terminal D of the low dropout voltage regulator to shift the zero sufficiently high in frequency to not cause instabilities.

The PMOS transistor P11 is an optional clamping transistor. The source of the PMOS transistor P11 is connected to the common connection F of the drain of the NMOS transistor N3, the gate of the NMOS transistor N4, and the drain of the PMOS transistor P7. The gate of the PMOS transistor P11 is connected to receive the reference voltage $V_{REF}$. The drain of the PMOS transistor P11 is connected to the ground reference voltage source. When the low dropout regulator is responding to input or output transient faults and the PMOS pass transistor P9 is in the deep triode operation region, the PMOS transistor P11 clamps the voltage at the common connection F, but does not prevent the overshoot of the voltage level $V_{LDO}$ at the output terminal D.

FIGS. 3a-3e are plots of voltage levels at various connection points within the low dropout voltage regulator of FIG. 2 during a voltage transient fault condition of the input voltage level VDD applied to the input voltage terminal E. If a line transient (100 of FIG. 3a) occurs that causes the voltage level VDD applied to the input voltage terminal E to have a voltage excursion that approaches or exceeds the regulated output voltage level $V_{LDO}$ (102 of FIG. 3e) present at the output terminal D, the internal nodes of the error amplifier $A_{ERR}$ will be skewed. In the present example, the transient of the voltage level VDD is from 3.5V to 2.97V and back to 3.5V. The rise and fall times for the input voltage level VDD are 4 μs. The voltage level $V_{ERR}$ at the output terminal B of the differential amplifier will be clamped (104 of FIG. 3b) close to ground. As the voltage level $V_{Fst1}$ at the common connection F begins to the rise (106 of FIG. 3c) as result of the NMOS transistor N3 being turned off, the gate-to-source voltage of the PMOS transistor P11 becomes large enough to turn on the PMOS transistor P11. The voltage level $V_{FST1}$ at the common connection F is clamped to a voltage level of approximately 2.4V or the gate-to-source voltage level (Vgs) of the PMOS transistor P11 greater than the reference voltage $V_{REF}$. With the output voltage level $V_{ERR}$ of the differential amplifier approaching a voltage level such that the NMOS transistor N3 is deep in to the triode region of operation, the majority of the current flowing through the PMOS transistor P7 will be flowing through the PMOS transistor P11. The voltage level $V_{Fst1}$ causes the NMOS transistor N4 to turn on and thus the voltage level $V_{GATE}$ (108 of FIG. 3d) at the output terminal C of the error amplifier $A_{ERR}$ approaches the voltage level of the ground reference voltage source and the PMOS pass transistor P9 is turned fully on to be in the deep triode operating region (110 of FIG. 3e).

When the line transient is removed (112 of FIG. 3a) and the voltage level VDD applied to the input voltage terminal E returns from the minimum voltage of the transient (2.97V) to the normal applied voltage level (3.5V), the error output voltage level $V_{ERR}$ (114 of FIG. 3b) at the output of the differential amplifier takes a finite time to reach its desired operating voltage. During this time the PMOS pass transistor P9 is turned on into deep triode region of operation (116 of FIG. 3d) and will source current to the output terminal D and the load capacitor $C_L$ and the load resistor $R_L$. This results in large voltage overshoot (118 of FIG. 3e) of approximately 250 mV at the output voltage level $V_{LDO}$. After a period of time the output voltage level $V_{LDO}$, will return (120 of FIG. 3e) to the regulated output voltage level $V_{LDO}$ of approximately 3.0V. The large voltage overshoot in the output voltage level $V_{LDO}$ may cause physical damage to the circuits and systems that compose the load capacitor $C_L$ and the load resistor $R_L$.

FIGS. 4a-4f are plots of voltage and current levels at various connection points within the low dropout voltage regulator of FIG. 2 during a 50 ma current transient fault condition of an output load current of an accessory connected to the low dropout voltage regulator of FIG. 2. The low dropout voltage regulator has a regulated output voltage level $V_{LDO}$ of approximately 2.4V in this example (122 of FIG. 4f) with a load current $I_{LOAD}$ of approximately 1 ma (124 of FIG. 4a) developed from an input voltage level VDD applied to the input voltage terminal E of approximately 2.7V (126 of FIG. 4b). The voltage level $V_{ERR}$ at the output terminal B of the differential amplifier is at approximately 378 mV (128 of FIG. 4c). The voltage level $V_{Fst1}$ at the common connection F is set to the voltage level is approximately 700 mV (130 of FIG. 4d). This forces the voltage level $V_{GATE}$ at the gate of the PMOS pass transistor P9 to be 1.87V (132 of FIG. 4e).

Figure 4A:
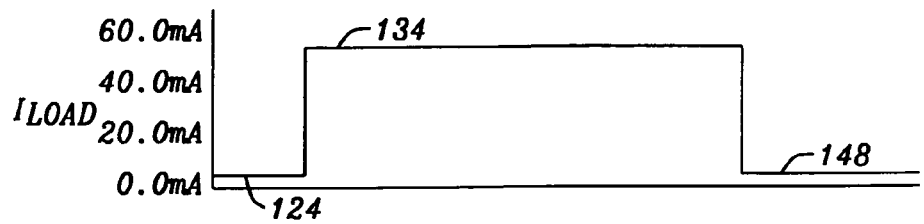
FIGS. 4a-4f are plots of voltage and current levels at various connection points within the low dropout voltage regulator of FIG. 2 during a 50 ma current transient fault condition of an output load current of an accessory connected to the low dropout voltage regulator of FIG. 2.
Figure 4B:
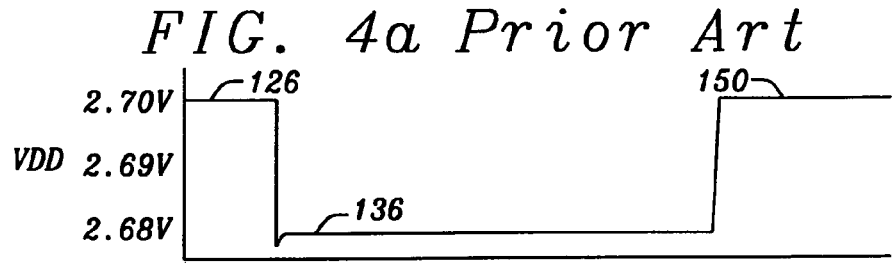
Figure 4C:
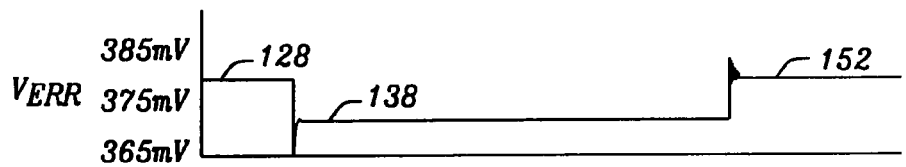
Figure 4D:
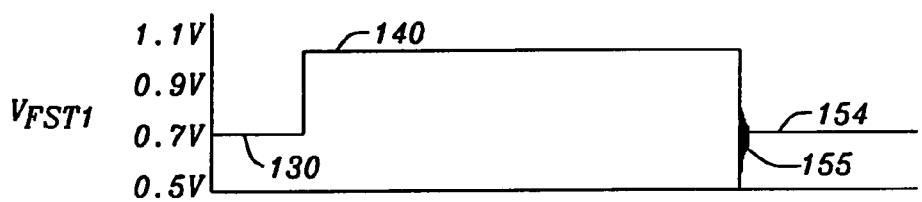

The accessory of the low dropout voltage regulator increases its load current $I_{LOAD}$ from the output terminal D to a value of approximately 50mA (134 of FIG. 4a). The causes the feedback loop to modify the potential of internal nodes of low dropout voltage regulator such that the low dropout voltage regulator can supply the 50 mA load current. After a sharp negative voltage spike, the voltage level $V_{ERR}$ at the output terminal B of the differential amplifier drops from 378 mV to 373 mV (138 of FIG. 4c). The voltage level $V_{FST1}$ at the node F increases to a voltage of 1.02V (138 of FIG. 4c) and the voltage $V_{GATE}$ at the gate of the PMOS pass transistor P9 reduces from 1.87V to 1.42V. The regulated output voltage level $V_{LDO}$ present at the output terminal D spikes negatively to a voltage level of approximately 2.38V for a brief period of time and then resumes control at the regulated voltage level of approximately 2.40V (146 of FIG. 4f). The input voltage level VDD applied to the input voltage terminal E decreases by a voltage of approximately 15 mV to approximately 2.685V (136 of FIG. 4b).

When the accessory no longer requires the load current of 50 mA, the load current $I_{LOAD}$ is restored to the level of 1 mA (148 of FIG. 4a). The adjustment of the voltage levels of the feedback loop causes the voltage level $V_{ERR}$ at the output terminal B of the differential amplifier to return to a voltage level of approximately 378 mV (138 of FIG. 4c) after a period of ringing. The voltage level $V_{FST1}$ at the node F has a period of ringing (155 of FIG. 4d) with spiking to a voltage level of approximately 0.5V prior to settling in to a voltage level of approximately 378 mV (154 of FIG. 4d).

Figure 4E:
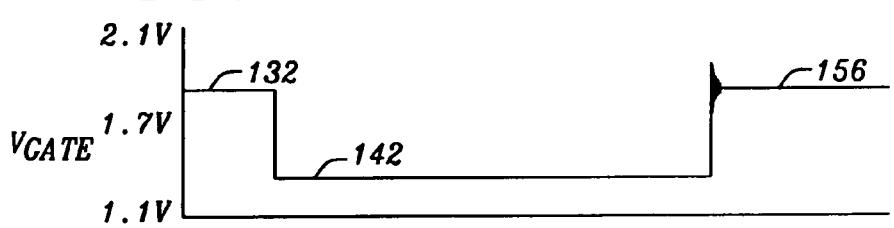
Figure 4F:
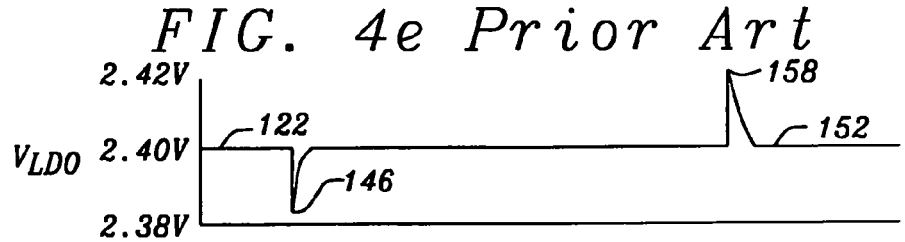

The voltage $V_{GATE}$ at the gate of the PMOS pass transistor P9 similarly has period of ringing before settling to the operating voltage level of approximately 1.87V (156 of FIG. 4e. The regulated output voltage level $V_{LDO}$ present at the output terminal D spikes positively by a voltage of approximately 22 mV to a voltage level of approximately 2.42V (158 of FIG. 4*f*) for a brief period of time. The regulated output voltage level $V_{LDO}$ then resumes control at the regulated voltage level of approximately 2.40V (160 of FIG. 4*f*).

FIGS. 5*a*-5*f* are plots of voltage and current levels at various connection points within the low dropout voltage regulator of FIG. 2 during a 200 ma current transient of an output load current of an accessory connected to the low dropout voltage regulator of FIG. 2. The low dropout voltage regulator has a regulated output voltage level $V_{LDO}$ of approximately 2.4V in this example (172 of FIG. 5*f*) with a load current $I_{LOAD}$ of approximately 1 ma (164 of FIG. 5*a*) developed from a input voltage level VDD applied to the input voltage terminal E of approximately 2.7V (162 of FIG. 5*b*). The voltage level $V_{ERR}$ at the output terminal B of the differential amplifier is at approximately 378 mV (128 of FIG. 5*c*). The voltage level $V_{Fst1}$ at the common connection F is set to the voltage level is approximately 700 mV (168 of FIG. 5*d*). This forces the voltage level $V_{GATE}$ at the gate of the PMOS pass transistor P9 to be 1.87V (170 of FIG. 5*e*).

The accessory connected to the low dropout voltage regulator increases its load current $I_{LOAD}$ from the output terminal D to a value of approximately 200 mA (174 of FIG. 5*a*) that is four times its maximum output drive capability. The low dropout voltage regulator will then go into current limit. As the low dropout voltage regulator is in current limit, the feedback loop modifies the potential of internal nodes of low dropout voltage regulator such that the voltage level $V_{ERR}$ at the output terminal B of the differential amplifier drops near the ground reference voltage level or approximately 119 mV (178 of FIG. 5*c*). The voltage level $V_{FST1}$ at the node F that is the junction of the drain of the NMOS transistor N3, the gate of the NMOS transistor N4, the drain of the PMOS transistor P7, and the source of the PMOS transistor P11, is clamped to a voltage of approximately 2.5V (180 of FIG. 5*d*) and the voltage $V_{GATE}$ at the gate of the PMOS pass transistor P9 reduces to close to the ground reference voltage level or approximately 134 mV (182 of FIG. 5*e*). The regulated output voltage level $V_{LDO}$ (144 of FIG. 5*f*) present at the output terminal D spikes negatively to a voltage level of approximately 2.35V for a brief period of time and then resumes control at the regulated voltage level of approximately 2.40V. The input voltage level VDD applied to the input voltage terminal E decreases by a voltage of approximately 70 mV to approximately 2.61V (176 of FIG. 5*b*).

Figure 5A:
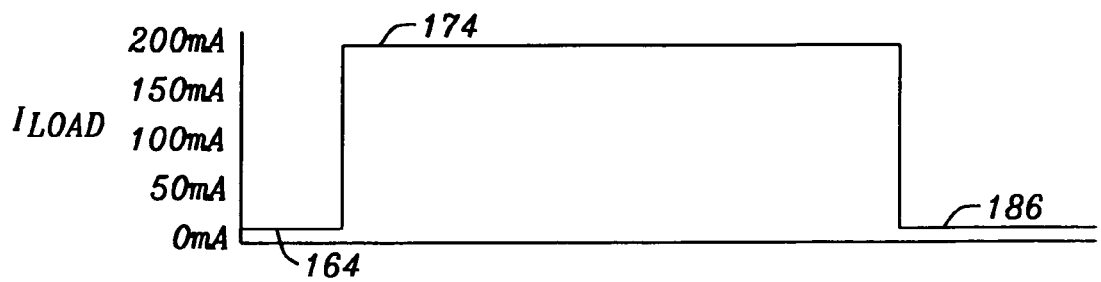
FIGS. 5a-5f are plots of voltage and current levels at various connection points within the low dropout voltage regulator of FIG. 2 during a 200 ma current transient fault condition of an output load current of an accessory connected to the low dropout voltage regulator of FIG. 2.
Figure 5B:
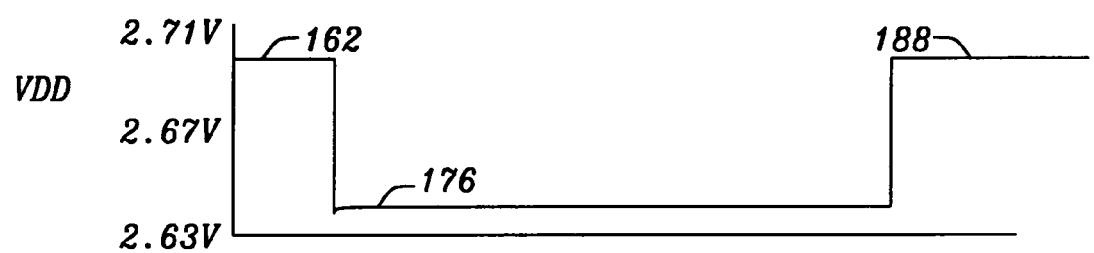
Figure 5C:
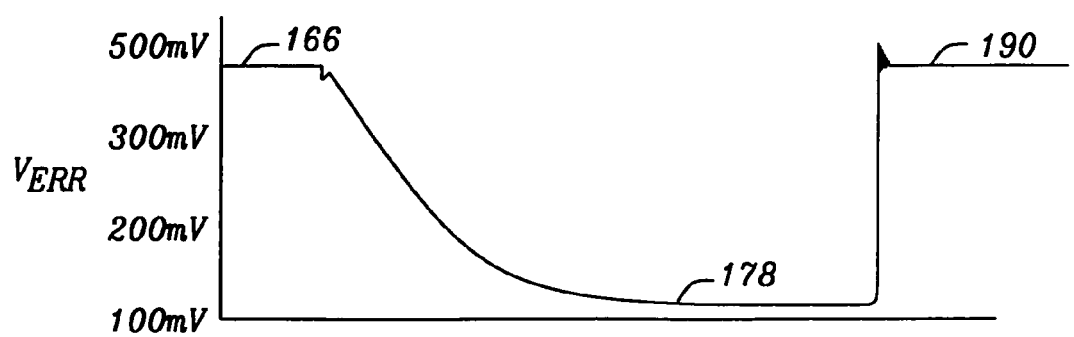
Figure 5D:
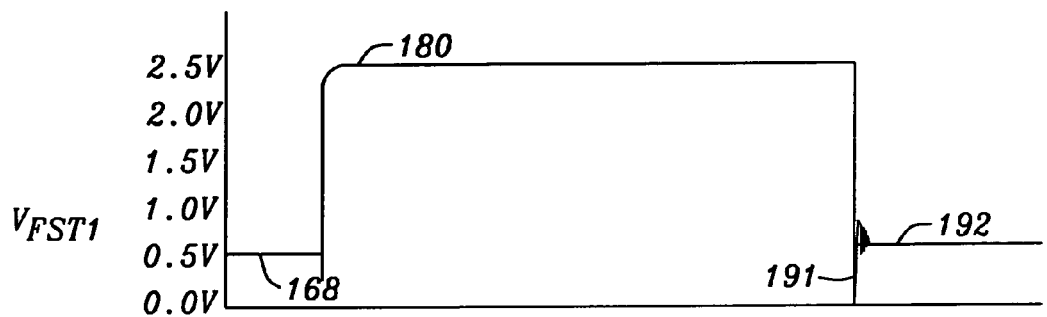

When the accessory no longer requires the load current of 200mA, the load current $I_{LOAD}$ is restored to the level of 1 mA (148 of FIG. 5*a*). The adjustment of the voltage levels of the feedback loop causes the voltage level $V_{ERR}$ at the output terminal B of the differential amplifier to return to a voltage level of approximately 378 mV (190 of FIG. 5*c*) after a period of ringing. The voltage level $V_{FST1}$ at the node F has a period of ringing with spike to the ground reference voltage level (191 of FIG. 5*d*) prior to settling in to a voltage level of approximately 700 mV (192 of FIG. 4*d*).

Figure 5E:
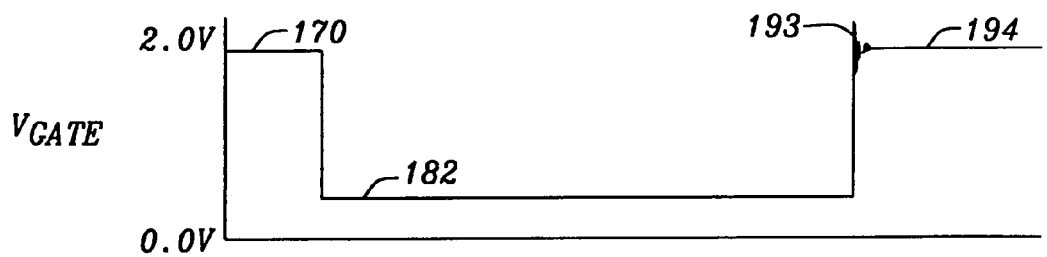
Figure 5F:
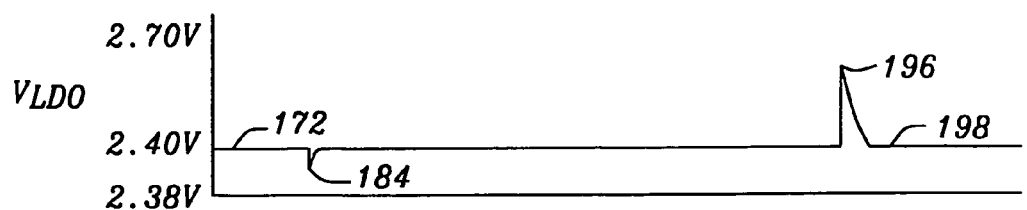

The voltage $V_{GATE}$ at the gate of the PMOS pass transistor P9 similarly has period of spiking (193 of FIG. 5*e*) before settling to the operating voltage level of approximately 1.87V (194 of FIG. 5*e*). The regulated output voltage level $V_{LDO}$ present at the output terminal D overshoots positively by a voltage of approximately 270 mV to a voltage level of approximately 2.67V (196 of FIG. 5*f*) for a brief period of time. The regulated output voltage level $V_{LDO}$ then resumes control at the regulated voltage level of approximately 2.40V (198 of FIG. 5*f*).

Figure 6:
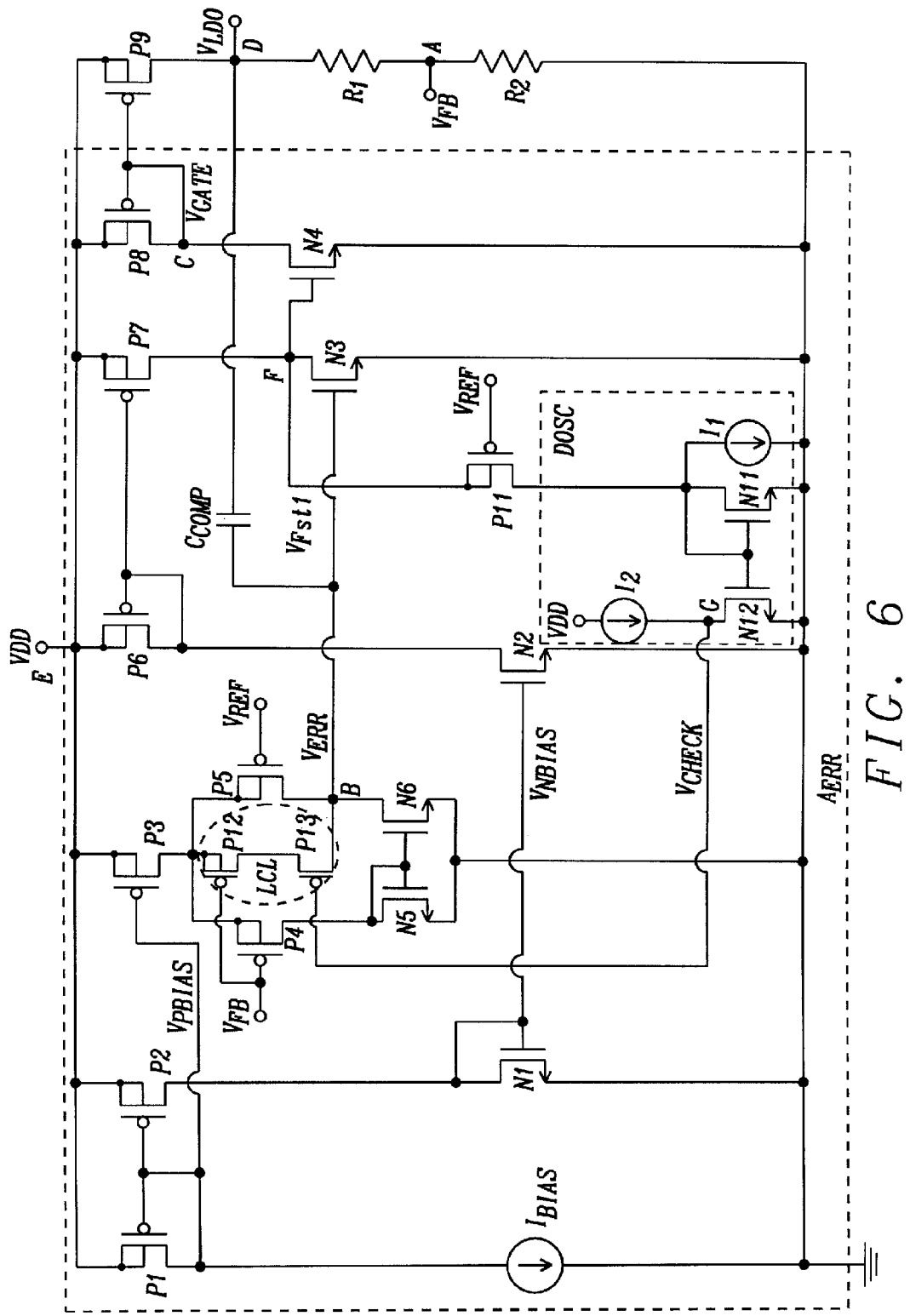
FIG. 6 is a schematic diagram of a low dropout voltage regulator of an implementation embodying the principals of the present disclosure.

FIG. 6 is a schematic diagram of a low dropout voltage regulator of the present disclosure. The structure and function of the low dropout voltage regulator is as shown in FIG. 2 with the exception of the addition of the local control loop LCL and the transient fault sense circuit DOSC. The local control loop LCL and the transient fault sense circuit DOSC sense that the low dropout voltage regulator is in responding to an input transient voltage fault or output transient current fault. The transient fault sense circuit DOSC is connected to the drain of the PMOS transistor P11. The gate and drain of the diode connected NMOS transistor N11 is connected to the drain of the PMOS transistor P11 and to a first terminal of the first biasing current source $I_1$. The second terminal of the first biasing current source $I_1$ and the source of the NMOS transistor N11 are connected to the ground reference voltage source. The drains of the PMOS transistor P11 and the NMOS transistor N11, the gate of the NMOS transistor N11, and the first terminal of the first biasing current source are connected to the gate of the NMOS transistor N12. The source of the NMOS transistor N12 is connected to the ground reference voltage source. The drain of the NMOS transistor N12 is connected to the check terminal G that is connected to the local control loop LCL. The gate of the PMOS transistor P13 is connected to the check terminal G and thus to the drain of the NMOS transistor N12. A first terminal of the second biasing current source $I_2$ is connected to receive the input voltage level VDD. The second terminal of the second biasing current source $I_2$ is connected to the check terminal G and the drain of the NMOS transistor N12.

The local control loop LCL includes the PMOS transistors P12 and P13. The source of the PMOS transistor P12 is connected to the common sources of the differential pair of PMOS transistors P4 and P5. The gate of the PMOS transistor P12 is connected to receive the feedback voltage level $V_{FB}$ from the common connection A of the series resistors $R_1$ and $R_2$. The drain of the PMOS transistor P12 is connected to the source of the PMOS transistor P13 and the source of the PMOS transistor P13 is connected to the output terminal B of the differential pair of transistors P4 and P5.

The PMOS transistor P12 essentially forms a differential pair of transistors with the PMOS transistor P5 to compare the voltage differential between the feedback voltage $V_{FB}$ and the reference voltage level $V_{REF}$. The PMOS transistor P13 is a gating transistor that is activated when the PMOS pass transistor P9 is forced into the deep triode operating region due to the transient voltage present at the input terminal E causing a negative voltage excursion of the input voltage level VDD.

FIGS. 7*a*-7*f* are plots of voltage levels at various connection points within the low dropout voltage regulator of FIG. 6 during a voltage transient of the input voltage level VDD applied to the input voltage terminal E. If a line transient (200 of FIG. 5*a*) occurs that causes the input voltage level VDD applied to the input voltage terminal E to have a voltage excursion that approaches or exceeds the regulated output voltage level $V_{LDO}$ (205 of FIG. 5*f*) present at the output terminal D, the internal nodes of the error amplifier $A_{ERR}$ will be skewed. In the present example, the transient of the voltage level VDD is from 3.5V to 2.97V and back to 3.5V. The rise and fall times for the input voltage level VDD are 4 μs. The voltage level $V_{ERR}$ at the output terminal B of the differential amplifier will now be clamped (210 of FIG. 5*b*) close to its operating point. As the voltage level $V_{Fst1}$ at the common connection F begins to the rise (215 of FIG. 5*c*) as result of the NMOS transistor N3 being closer to being turned off, the gate-to-source voltage of the PMOS transistor P11 becomes large enough to turn on the PMOS transistor P11. The voltage level $V_{FST1}$ at the common connection F is clamped to a voltage level of approximately 2.4V or the gate-to-source voltage level (Vgs) of the PMOS transistor P11 greater than the reference voltage $V_{REF}$. With the output voltage level $V_{ERR}$ of the differential amplifier being a lower voltage such that the NMOS transistor N3 is not conducting to the degree that it was during operation, the majority of the current flowing through the PMOS transistor P7 will be flowing through the PMOS transistor P11. The voltage level $V_{Fst1}$ causes the NMOS transistor N4 to turn on and thus the voltage level $V_{GATE}$ (230 of FIG. 3d) at the output terminal C of the error amplifier $A_{ERR}$ approaches the voltage level of the ground reference voltage source and the PMOS pass transistor P9 is turned fully on to be into the deep triode operating region (235 of FIG. 5f).

The current through the PMOS transistor P11 is passed through the diode connected transistor N11 and the current source $I_1$ and the voltage at the gate increases sufficiently to turn on the NMOS transistor N12. The voltage $V_{CHECK}$ (220 of FIG. 5d) at the check terminal G decreases and turns on the gating PMOS transistor P13. The local control loop LCL begins to regulate the differential amplifier by balancing the current in the active load of the NMOS transistors N5 and N6 of the differential amplifier. The current deficit in the PMOS transistor P5 resulting from the change in the input voltage level VDD is compensated for by the current contributed through the PMOS transistors P12 and P13. This compensation current forces the voltage level $V_{ERR}$ at the output terminal B of the differential amplifier to be clamped (210 of FIG. 5b) close to its operating point.

When the line transient is removed (245 of FIG. 5a) and the voltage level VDD applied to the input voltage terminal E returns from the minimum voltage of the transient (2.97V) to the normal applied voltage level (3.5V), the error output voltage level $V_{ERR}$ (245 of FIG. 5b) at the output of the differential amplifier takes much less time to reach its desired operating voltage. During this time the PMOS pass transistor P9 comes out of the deep triode operating region (265 of FIG. 3d) and will source the correct current to the output terminal D and the load capacitor $C_L$ and the load resistor $R_L$. The output voltage level $V_{LDO}$ will return to the regulated output voltage level $V_{LDO}$ of approximately 3.0V and the large voltage overshoot is reduced or eliminated.

The voltage level $V_{Fst1}$ (250 of FIG. 5c) at the common connection F falls back to operating point and the voltage $V_{CHECK}$ (255 of FIG. 5d) at the check terminal G decreases to disable the PMOS transistors P12 and P13 of the local control loop LCL. The NMOS transistor N4 is now operated in a saturation mode such that the gate voltage $V_{GATE}$ (260 of FIG. 5e) is returned to its operating voltage.

The first biasing current source $I_1$ is provided to insure that the NMOS transistor N11 is not conducting under normal operations to further disable the PMOS transistors P12 and P13 of the local control loop LCL.

Figure 8:
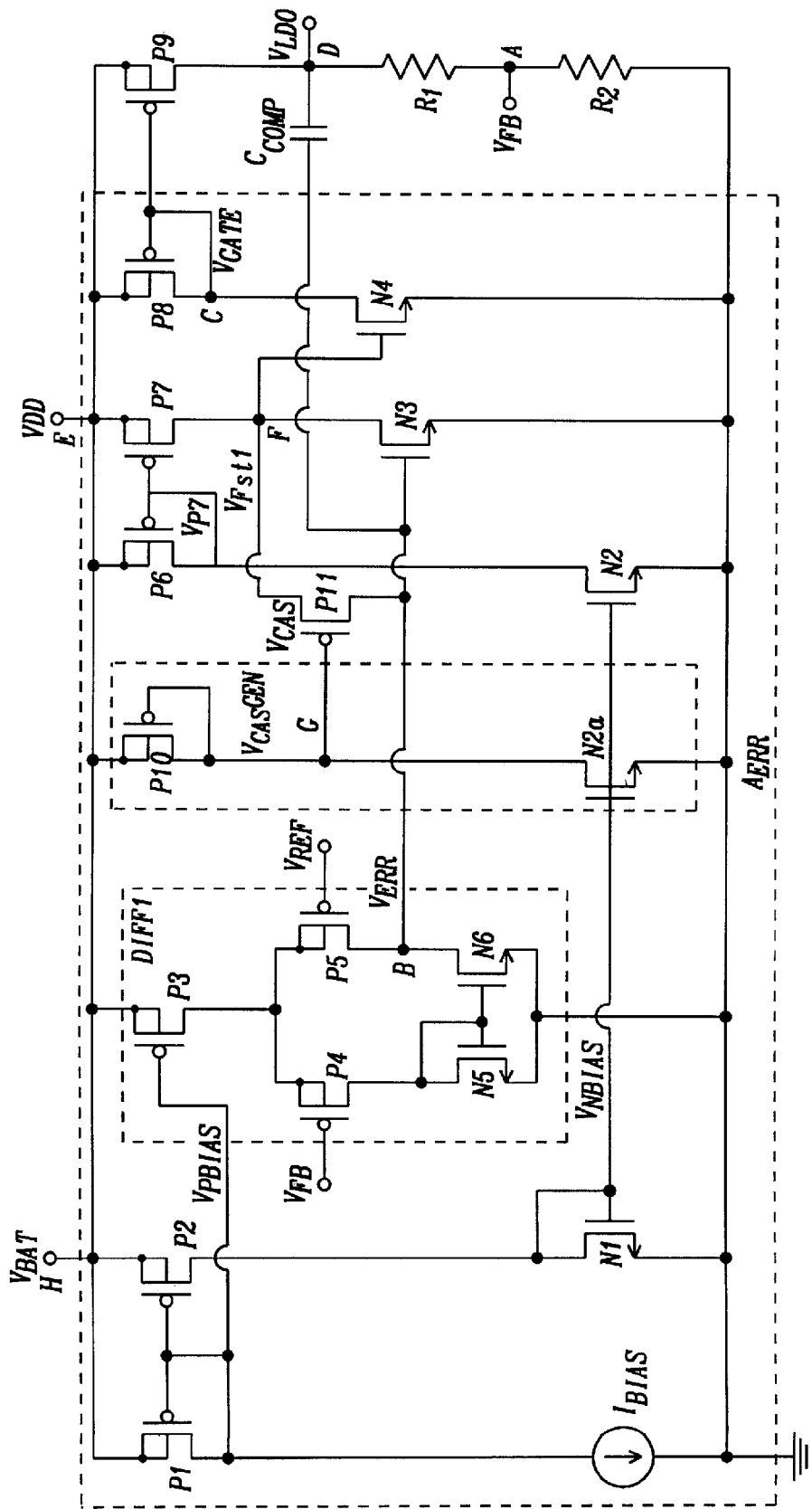
FIG. 8 is a schematic diagram of a low dropout voltage regulator of another implementation embodying the principals of the present disclosure.
Figure 9A:
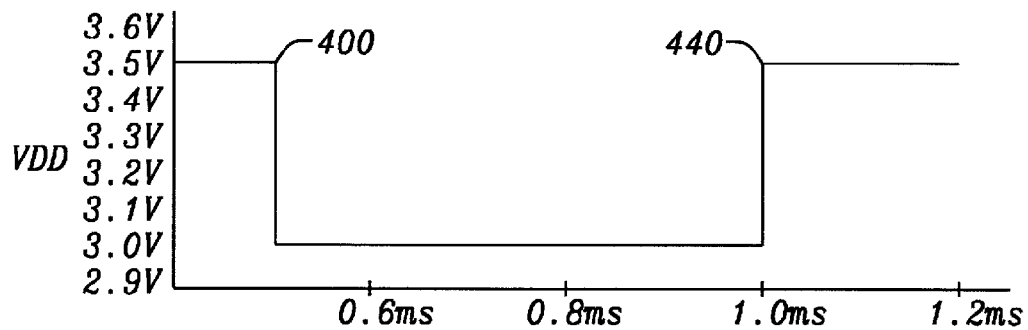
FIGS. 9a-9e are plots of voltage levels at various connection points within the low dropout voltage regulator of FIG. 8 during a voltage transient of the input voltage.
Figure 9B:
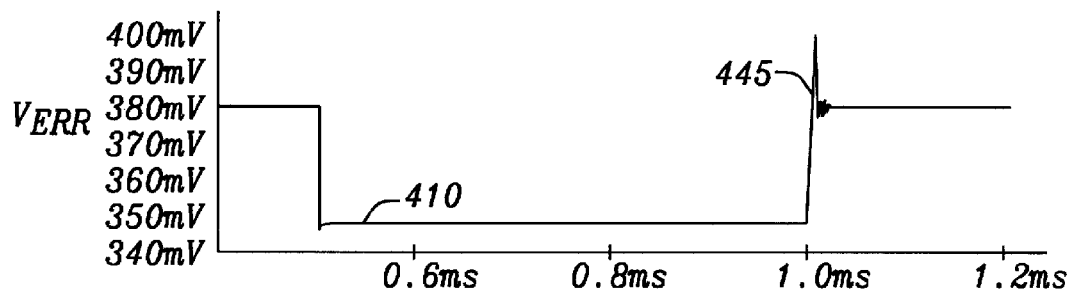
Figure 9C:
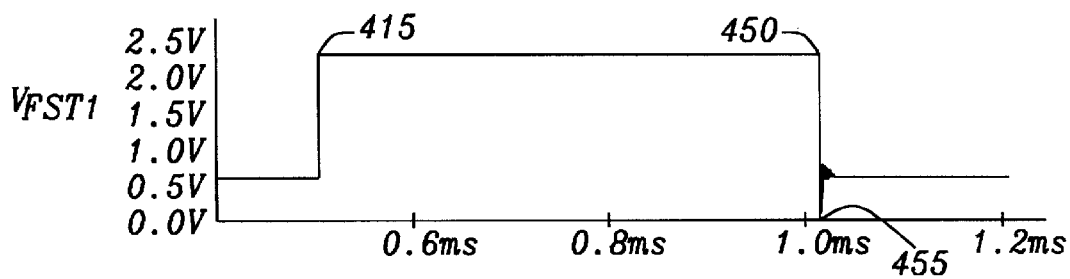
Figure 9D:
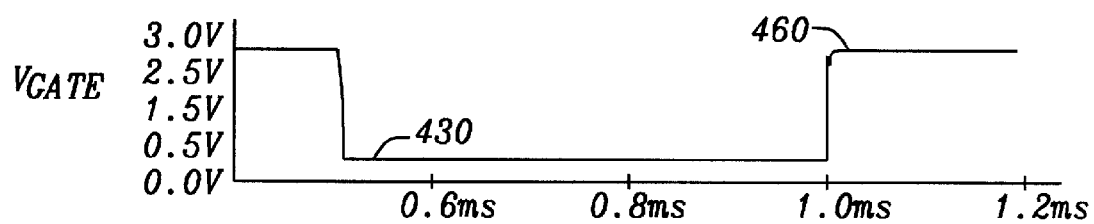
Figure 9E:
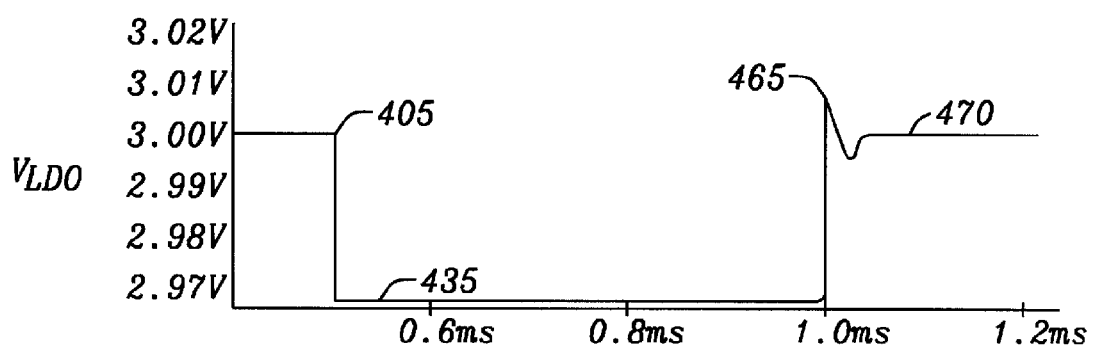

FIG. 8 is a schematic diagram of a low dropout voltage regulator of a second implementation embodying the principals of the present disclosure. The structure and function of the low dropout voltage regulator is as shown in FIG. 2 with the exception of the addition of the cascode voltage generator formed of the PMOS transistor P10 and the NMOS transistor N2a. Additionally, the sources of the PMOS transistors P1 and P2 of the biasing current source $I_{BIAS}$ and the PMOS transistor P3 of the biasing current source are now connected to the battery supply voltage source $V_{BAT}$ at the node H and the diode connected PMOS transistors P6 and P8 and the PMOS load transistor P7 are connected to the input pass voltage level VDD at the node E.

The cascode voltage as generated by the PMOS transistor P10 and the NMOS transistor N2a has a lower amplitude than the gate voltage of the PMOS transistor P7. The gate and drain of the diode connected PMOS transistor P10 is connected to the drain of the NMOS transistor N2a and to the gate of the PMOS transistor P11 at the terminal C. The source of the PMOS transistor P10 is connected to the power supply voltage source VDD at the terminal E. The source of the NMOS transistor N2a is connected to the ground reference voltage source. The gate of the NMOS transistor N2a is connected to receive the biasing voltage $V_{NBIAS}$.

The drain of the PMOS transistor P11, the gate of the NMOS transistor N3, and the first plate of the compensation capacitor $C_{COMP}$ are connected to the output terminal B of the differential pair of transistors P4 and P5 of the differential amplifier DIFF1 as the error voltage $V_{ERR}$.

When the low dropout voltage regulator goes is responding to input or output transient faults, the output voltage decreases causing the feedback voltage $V_{FB}$ amplitude to become less than the reference voltage level $V_{REF}$. This causes output voltage level $V_{ERR}$ of the differential amplifier DIFF1 to approach the voltage level of the ground reference voltage such that that the transistor N3 is nearly switched off. The voltage level $V_{Fst1}$ at the node F increases to the input pass voltage level VDD to fully turn on the NMOS transistor N4 and thus forcing the voltage level $V_{GATE}$ at the node C to be close to the ground reference voltage level thus forcing the PMOS pass transistor P9 deep into triode region of operation.

When voltage level $V_{Fst1}$ at the common connection F is approaching the voltage level of the input pass voltage level VDD, the PMOS transistor P11 begins to conduct and a portion of the current from the PMOS transistor P7 flows via the PMOS transistor P11 into the drain of the load NMOS transistor N6 and balances the current in the active load for the differential amplifier DIFF1. The voltage level $V_{ERR}$ at the output node B of the differential amplifier DIFF1 is prevented from being pulled to ground reference voltage source and maintains it close to the operating voltage level of the differential amplifier DIFF1 while PMOS pass transistor P9 is forced into deep triode region of operation. This allows the control loop to respond very quickly to control the gate of PMOS pass transistor P9 and minimizes any overshoot of the output voltage level $V_{LDO}$ at the output node D, when the transient is removed from the input pass power supply voltage source VDD.

FIGS. 9a-9e are plots of voltage levels at various connection points within the low dropout voltage regulator of FIG. 8 during a voltage transient of the input voltage level VDD applied to the input voltage terminal E. If a line transient (400 of FIG. 7a) occurs that causes the input pass voltage level VDD applied to the input voltage terminal E to have a voltage excursion that approaches or exceeds the regulated output voltage level $V_{LDO}$ (405 of FIG. 7f) present at the output terminal D, the internal nodes of the error amplifier $A_{ERR}$ are skewed. In the present example, the transient of the input pass voltage level VDD is from approximately 3.5V to approximately 2.97V and back to approximately 3.5V. The rise and fall times for the input pass voltage level VDD are 4 μs. The voltage level $V_{ERR}$ at the output terminal B of the differential amplifier DIFF1 will now be forced (410 of FIG. 7b) close to its operating point. The voltage level $V_{Fst1}$ at the common connection F begins to the rise (415 of FIG. 7c) as result of the NMOS transistor N3 being closer to being turned off. The cascode voltage level $V_{CAS}$ at the output terminal G of the cascode voltage generator and connected to the gate of the PMOS transistor P11 becomes large enough to turn on the PMOS transistor P11. The voltage level $V_{FST1}$ at the common connection F is clamped to a voltage level of approximately 2.4V. The current flowing through the PMOS transistor P7 now flows through the PMOS transistor P11 and into the drain of the load NMOS transistor N6. The compensation current from the PMOS transistor P7 forces the error output voltage level $V_{ERR}$ at the output terminal B of the differential amplifier DIFF1 to be clamped (410 of FIG. 7b) close to its operating point.

Figure 7A:
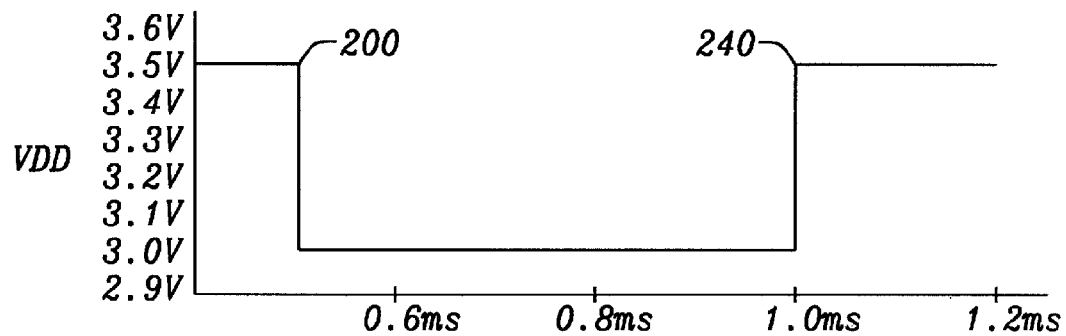
FIGS. 7a-7f are plots of voltage levels at various connection points within the low dropout voltage regulator of FIG. 6 during a voltage transient of the input voltage.
Figure 7B:
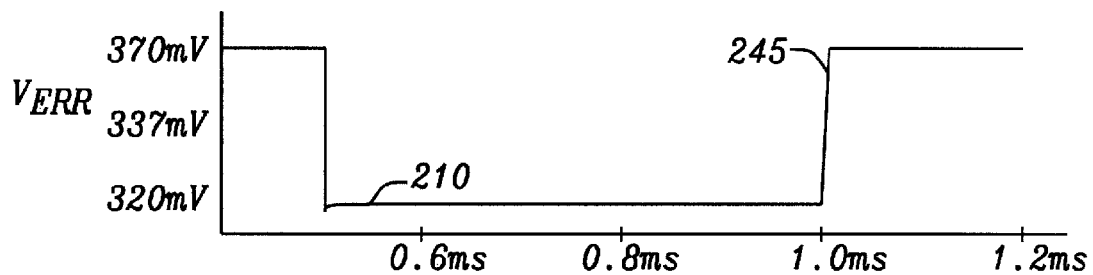
Figure 7C:
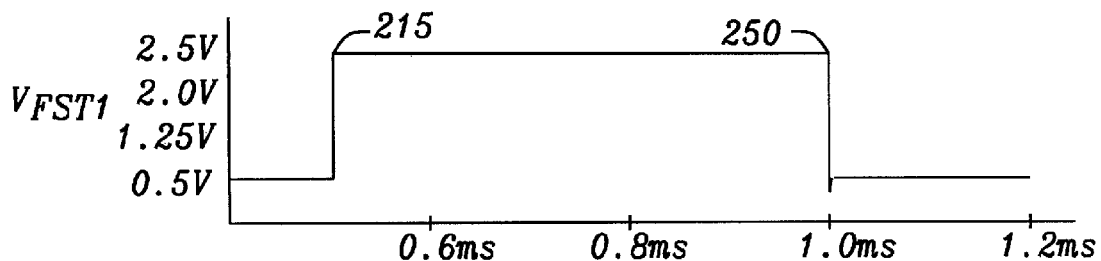
Figure 7D:
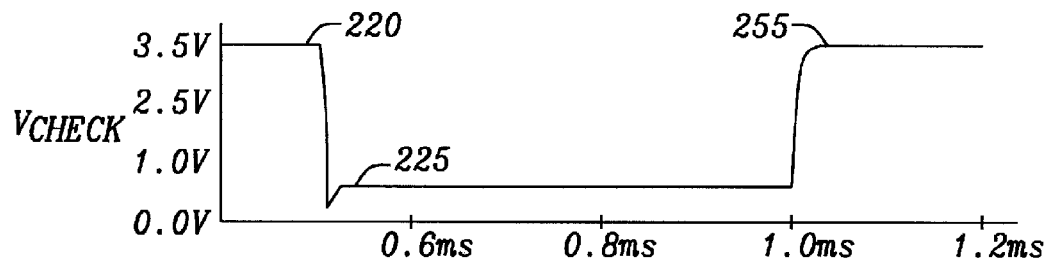
Figure 7E:
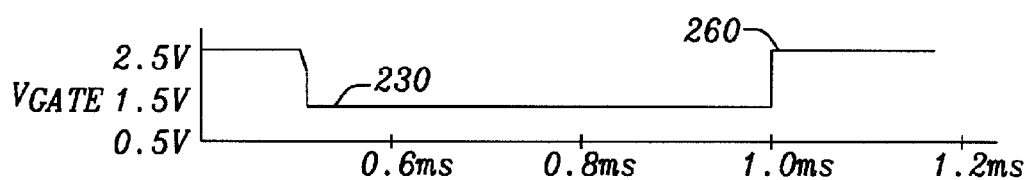
Figure 7F:
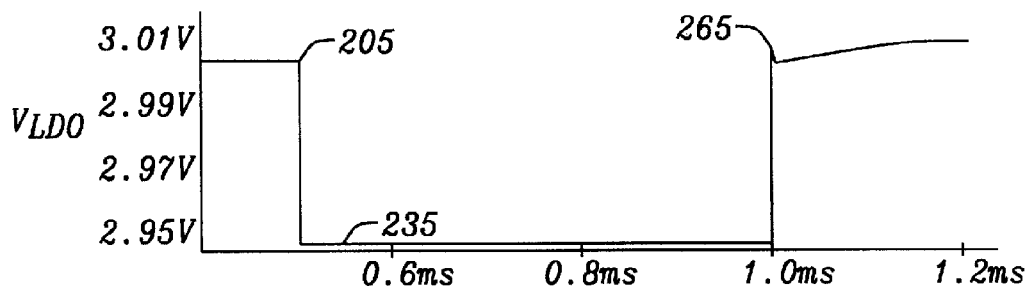

The voltage level $V_{Fst1}$ causes the NMOS transistor N4 to turn on and thus the voltage level $V_{GATE}$ at the output terminal C of the error amplifier $A_{ERR}$ approaches the voltage level (430 of FIG. 7d) of the ground reference voltage source and the PMOS pass transistor P9 is turned fully on to be into the deep triode operating region (435 of FIG. 7e).

When the line transient is removed (440 of FIG. 7a) and the input pass voltage level VDD applied to the input voltage terminal E returns from the minimum voltage of the transient (2.97V) to the normal applied voltage level (3.5V), the error output voltage level $V_{ERR}$ (445 of FIG. 7b) at the output terminal B of the differential amplifier DIFF1 takes much less time to reach its desired operating voltage. During this time the PMOS pass transistor P9 comes out of the deep triode operating region and will source the correct current to the output terminal D and the load capacitor $C_L$ and the load resistor $R_L$. The output voltage level $V_{LDO}$, will return to the regulated output voltage level of approximately 3.0V (465 of FIG. 7e) and the large voltage overshoot is reduced (470 of FIG. 7e) to approximately 20 mV.

The voltage level $V_{Fst1}$ (450 of FIG. 7c) at the common connection F falls back to operating point. The NMOS transistor N4 is now operated in a saturation mode such that the gate voltage $V_{GATE}$ (460 of FIG. 7e) is returned to its operating voltage.

FIGS. 10a-10f are plots of voltage and current levels at various connection points within the low dropout voltage regulator of FIGS. 6 and 8 during a 200 ma current transient fault condition of an output load current of an accessory connected to the low dropout voltage regulator of FIGS. 6 and 8. The low dropout voltage regulator has a regulated output voltage level $V_{LDO}$ of approximately 2.4V in this example (504 of FIG. 10f) with a load current $I_{LOAD}$ of approximately 1 ma (502 of FIG. 10a) developed from a input voltage level VDD applied to the input voltage terminal E of approximately 2.7V (500 of FIG. 10b). The voltage level $V_{ERR}$ at the output terminal B of the differential amplifier is at approximately 378 mV (506 of FIG. 10c). The voltage level $V_{Fst1}$ at the common connection F is set to the voltage level is approximately 700 mV (508 of FIG. 10d). This forces the voltage level $V_{GATE}$ at the gate of the PMOS pass transistor P9 to be 1.87V (510 of FIG. 10e).

The accessory of the low dropout voltage regulator increases its load current $I_{LOAD}$ from the output terminal D to a value of approximately 200 mA (514 of FIG. 10a) that is four times its maximum output drive capability. The low dropout voltage regulator will then go into current limit. As the low dropout voltage regulator is in current limit, the feedback loop modifies the potential of the new control loops of the low dropout voltage regulator of FIGS. 6 and 8 such that the voltage level $V_{ERR}$ at the output terminal B of the differential amplifier does not drop near the ground reference voltage level. The voltage level $V_{ERR}$ at the output terminal B of the differential amplifier is now maintained close to its operating condition or approximately 351 mV (520 of FIG. 10c). The voltage level $V_{FST1}$ at the node F is clamped to a voltage of approximately 2.27V (522 of FIG. 10d) and the voltage $V_{GATE}$ at the gate of the PMOS pass transistor P9 reduces to close to the ground reference voltage level or approximately 142 mV (524 of FIG. 10e). The regulated output voltage level $V_{LDO}$ present at the output terminal D spikes negatively to a voltage level of approximately 2.35V (512 of FIG. 10f) for a brief period of time and then resumes control at the regulated voltage level of approximately 2.40V (526 of FIG. 10f). The input voltage level VDD applied to the input voltage terminal E decreases by a voltage of approximately 70 mV to approximately 2.61V (516 of FIG. 10b).

Figure 10A:
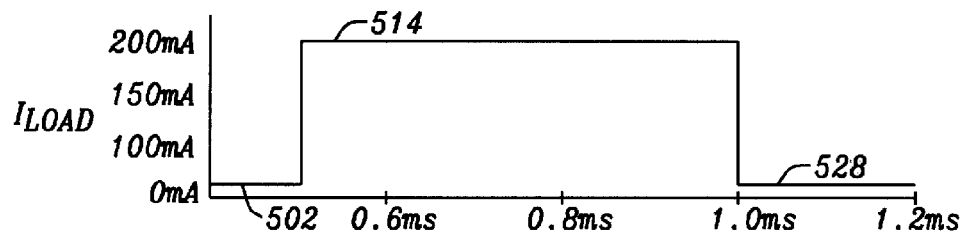
FIGS. 10a-10f are plots of voltage and current levels at various connection points within the low dropout voltage regulator of FIGS. 6 and 8 during a 200 ma current transient fault condition of an output load current of an accessory connected to the low dropout voltage regulator of FIGS. 6 and 8.
Figure 10B:
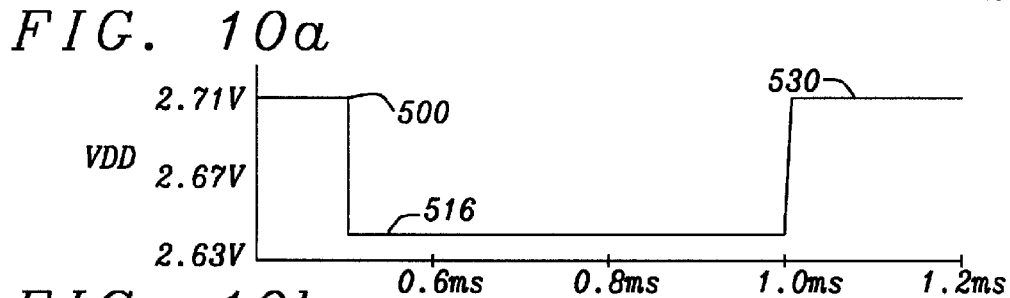
Figure 10C:
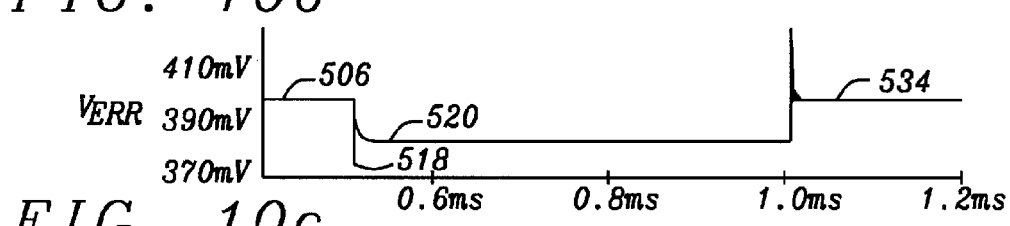
Figure 10D:
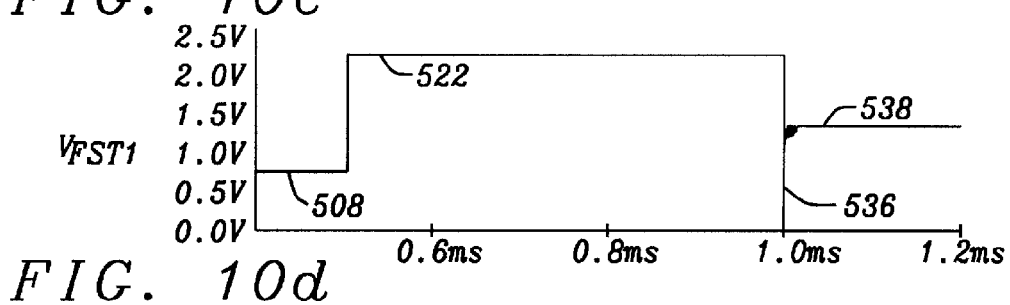

When the accessory no longer requires the load current of 200 mA, the load current $I_{LOAD}$ is restored to the level of 1 mA (528 of FIG. 10a). The adjustment of the voltage levels of the new control loops of the low dropout voltage regulator of FIGS. 6 and 8 causes the voltage level $V_{ERR}$ at the output terminal B of the differential amplifier to return to a voltage level of approximately 378 mV (534 of FIG. 10c) after a period of ringing (532 of FIG. 10c). The voltage level $V_{FST1}$ at the node F has a period of ringing with spiking to the ground reference voltage level (536 of FIG. 10d) prior to settling in to a voltage level of approximately 700 mV (538 of FIG. 4d).

Figure 10E:
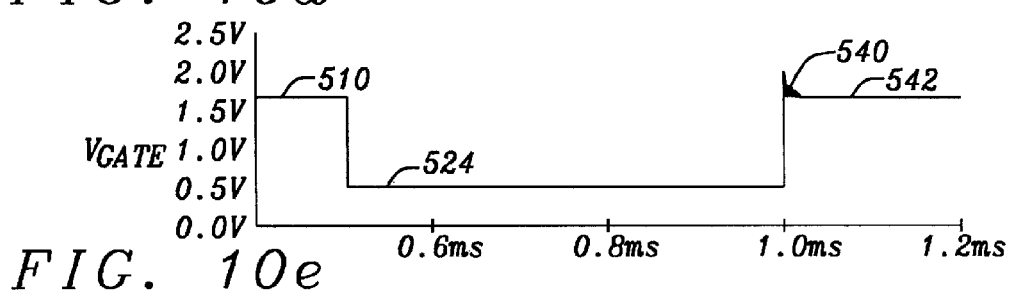
Figure 10F:
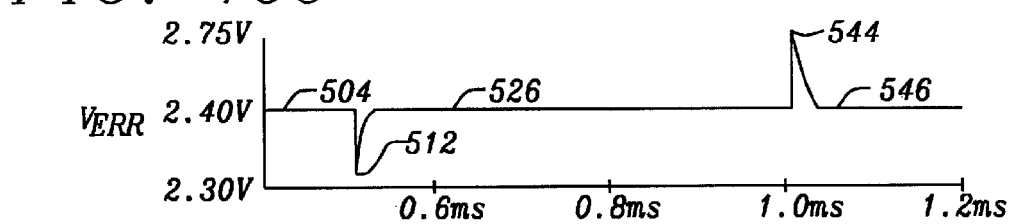

The voltage $V_{GATE}$ at the gate of the PMOS pass transistor P9 similarly has period of spiking (540 of FIG. 10e) before settling to the operating voltage level of approximately 1.87V (542 of FIG. 10e). The regulated output voltage level $V_{LDO}$ present at the output terminal D overshoots positively by a voltage of approximately 27 mV to a voltage level of approximately 2.427V (544 of FIG. 10f) for a brief period of time. The regulated output voltage level $V_{LDO}$ then resumes control at the regulated voltage level of approximately 2.40V (546 of FIG. 10f). Thus, the control loop balances the current in the active load for the differential amplifier and does not allow the output of differential amplifier to go close to ground but maintains it close to its operating condition to better control the recovery from the current transient fault conditions.

Figure 11:
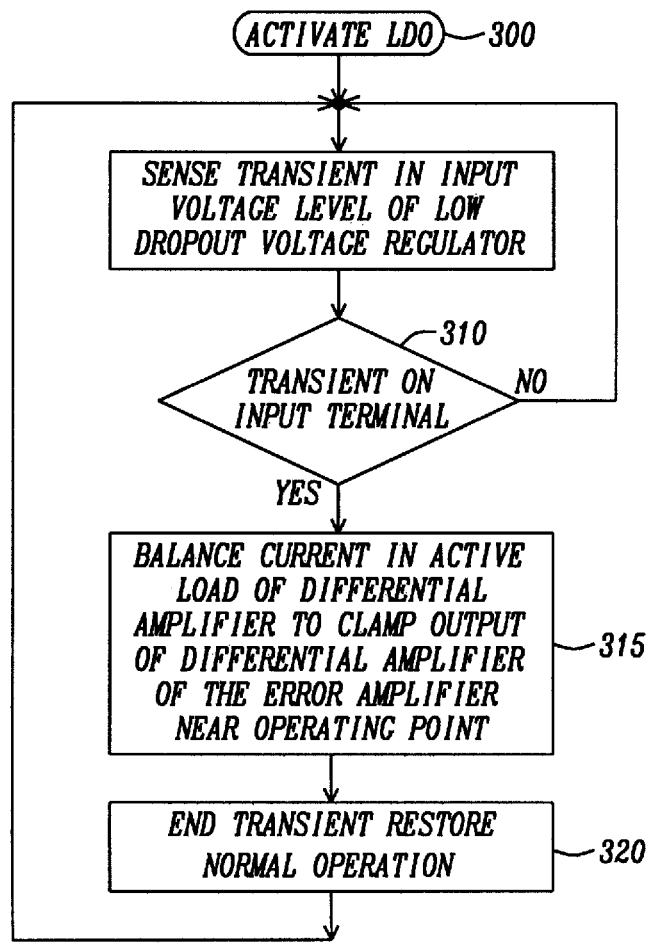
FIG. 11 is a flowchart for a method for maintaining regulation of an output voltage of the low dropout voltage regulator during transient fault conditions at the input or output terminals of the low dropout voltage regulator embodying the principals of this disclosure.

FIG. 11 is a flowchart for a method for reducing or eliminating overshoot at an output terminal of a low dropout voltage regulator resulting from a transient fault conditions occurring at an input terminal or an output terminal of the low dropout voltage regulator of this disclosure. The method is performed by an overshoot reduction circuit within the low dropout voltage regulator begins at the activation (Box 300) of the low dropout voltage regulator. The overshoot reduction circuit monitors an input voltage at the input terminal and the output terminal of the low dropout voltage regulator to sense (Box 305) if there is a transient fault condition occurring at the input terminal or the output terminal. If the transient fault condition occurring at an input terminal or an output terminal approaches or exceeds the regulated output voltage level $V_{LDO}$, the internal nodes of the error amplifier of the low dropout voltage regulator are skewed. The overshoot reduction circuit determines (Box 310) if the transient fault condition is present at the input or output terminal of the low dropout voltage regulator. If the transient fault condition is present at the input or output terminal, the overshoot reduction circuit has a control loop circuit that balances (Box 315) the current within the active load of the differential amplifier of the error amplifier to clamp the output of the differential amplifier to its normal operating point. If the overshoot reduction circuit with its control loop circuit for balancing the current in the active load were not present, the output of the differential amplifier would be clamped close to the ground reference voltage level. This causes the pass transistor of the low dropout voltage regulator to be into deep triode region of operation and to be delayed in assuming the regulating voltage level.

The transient fault condition ends (Box 320) and the output voltage of the error amplifier is set such that the pass transistor responds quickly to resume the regulation and the overshoot is reduced or eliminated and the overshoot reduction circuit resumes the sensing (Box 305) the input voltage level for the presence of the transient. The overshoot reduction circuit then disables the current balancing.

While this disclosure has been particularly shown and described with reference to the preferred embodiments thereof, it will be understood by those skilled in the art that various changes in form and details may be made without departing from the spirit and scope of the disclosure. In particular, the transistors of the low dropout regulator circuit of FIG. 4 are shown as PMOS and NMOS field effect transistors. The conductivity types of the PMOS transistors and the NMOS transistors may be exchanged such that those shown in FIG. 4 as PMOS transistors may be NMOS and the NMOS transistors may be PMOS transistors with attendant changing of the voltage levels. Further, the transistors of the low dropout voltage regulator may be P-type and N-type bipolar transistors and be in keeping with the scope of this disclosure.

What is claimed is:

1. A control loop circuit for balancing an active load current in an error amplifier of a low dropout voltage regulator resulting from removal of a transient fault conditions applied to an input terminal or output terminal of the low dropout voltage regulator, the control loop circuit comprising:
   a transient fault sense circuit configured to be in communication with a pass transistor of the low dropout voltage regulator for determining that the low dropout voltage regulator is responding to input or output transient faults and generating a transient fault indicator signal indicating that the low dropout voltage regulator is responding to input or output transient faults; and
   a local control loop connected to an output terminal of the transient fault sense circuit configured to receive the transient indicator signal communicating that the low dropout voltage regulator is responding to input or output transient faults;
   wherein the control loop circuit is configured such that when the transient fault indicator signal indicates that the low dropout voltage regulator is responding to input or output transient faults, the local control loop balances the active load current of the differential amplifier that clamps an output of a differential amplifier at a voltage level approaching an operating level, while a pass transistor of the low dropout voltage regulator is maintained in deep triode region of operation for insuring fast response in controlling the gate of the pass transistor to minimize overshoot when the input terminal or output terminal is returned to its normal operating voltage or current.

2. The control loop circuit for balancing an active load current in an error amplifier of claim 1 wherein the transient fault sense circuit comprises:
   an input terminal connected to an output driver of the low dropout voltage regulator for indicating that the low dropout voltage regulator is responding to input or output transient faults;
   a first transistor of a first conductivity type having a source terminal connected to a sense point within the output driver of the low dropout voltage regulator, a gate connected to a reference voltage source such that when a voltage level at the sense point increases sufficiently large, the first transistor of the first conductivity type is conducting to indicate that the voltage level at the output of the low dropout voltage regulator is below the required regulated voltage and the low dropout voltage regulator is in deep triode region of operation;
   a first transistor of a second conductivity type having a gate and drain connected to the drain of the first transistor of the first conductivity type and a source connected to the ground reference voltage source;
   a second transistor of the second conductivity type has a gate connected to the gate and drain of the first transistor of the second conductivity type, a source connected to the ground reference voltage source, and a drain connected to the output terminal of the transient fault sense circuit to transfer the transient fault indicator signal to the input terminal of the local control loop;
   a constant current sink having a first terminal connected to the gate and drain of the first transistor of the second conductivity type, a second terminal connected to the ground reference voltage source such that the constant current sink insures that in normal operation, the first transistor of the second conductivity type is not conducting and the transient fault indicator signal indicates that the transient fault conditions have not occurred; and
   a constant current source having a first terminal connected to the input terminal of the low dropout voltage regulator and a second terminal connected to the output terminal of the transient fault sense circuit.

3. The control loop circuit for balancing an active load current in an error amplifier of claim 2 wherein the local control loop comprises:
   a second transistor of the first conductivity type having a gate connected to the input terminal of the local control loop to receive the transient fault indicator signal, a drain connected to output terminal of the differential amplifier, and
   a third transistor of first conductivity type having a drain connected to a drain of the second transistor of the first conductivity type, a source connected to a biasing current source of the differential amplifier, and a gate connected to receive a feedback voltage that is scaled from an output voltage level of the output terminal of the low dropout voltage regulator.

4. The control loop circuit for balancing an active load current in an error amplifier of claim 3 wherein when a voltage transient occurs at the input terminal of the low dropout voltage regulator, the output of the differential amplifier decreases and the voltage at the source of the first transistor of the first conductivity type increases, the first transistor of the first conductivity type and the second transistor of the second conductivity type begin to conduct generating the transient fault indicator signal forcing the voltage at the gate of the second transistor of the first conductivity type to decrease dramatically as the second transistor of the second conductivity type begins to saturate causing the second transistor of the first conductivity type to conduct, and wherein the voltage difference between the feedback voltage level and the voltage level of the input terminal of the low dropout voltage regulator causes the third transistor of the first conductivity type to conduct causing the output voltage level of the error amplifier to be clamped close to its operating level and the low dropout voltage regulator can assume regulation without a large output voltage overshoot.

5. A low dropout voltage regulator comprising:
   a control loop circuit for balancing an active load current in an error amplifier of a low dropout voltage regulator resulting from removal of a transient fault conditions applied to an input terminal or output terminal of the low dropout voltage regulator, the control loop circuit circuit comprising:
   a transient fault sense circuit configured to be in communication with a pass transistor of the low dropout voltage regulator for determining that the low dropout voltage regulator is responding to input or output transient faults and generating a transient fault indicator signal indicating that the low dropout voltage regulator is responding to input or output transient faults; and a local control loop connected to an output terminal of the transient fault sense circuit configured to receive the transient fault indicator signal communicating that the low dropout voltage regulator is responding to input or output transient faults;

wherein the control loop circuit is configured such that when the transient fault indicator signal indicates that the low dropout voltage regulator is responding to input or output transient faults, the local control loop clamps an output of a differential amplifier at a voltage level approaching an operating level, while a pass transistor of the low dropout voltage regulator is maintained in deep triode region of operation for insuring fast response in controlling the gate of the pass transistor to minimize overshoot when the input terminal of the low dropout voltage regulator is ending and the voltage level present at the input terminal is returned to its normal operating voltage.

6. The low dropout voltage regulator of claim 5 wherein the transient fault sense circuit comprises:
   an input terminal connected to an output driver of the low dropout voltage regulator for indicating that the low dropout voltage regulator is responding to input or output transient faults;
   a first transistor of a first conductivity type having a source terminal connected to a sense point within the output driver of the low dropout voltage regulator, a gate connected to a reference voltage source such that when a voltage level at the sense point increases sufficiently large, the first transistor of the first conductivity type is conducting to indicate that the voltage level at the output of the low dropout voltage regulator is below the required regulated voltage and the low dropout voltage regulator is in the deep triode region of operation;
   a first transistor of a second conductivity type having a gate and drain connected to the drain of the first transistor of the first conductivity type and a source connected to the ground reference voltage source;
   a second transistor of the second conductivity type has a gate connected to the gate and drain of the first transistor of the second conductivity type, a source connected to the ground reference voltage source, and a drain connected to the output terminal of the transient fault sense circuit to transfer the transient fault indicator signal to the input terminal of the local control loop;
   a constant current sink having a first terminal connected to the gate and drain of the first transistor of the second conductivity type, a second terminal connected to the ground reference voltage source such that the constant current sink insures that in normal operation, the first transistor of the second conductivity type is not conducting and the transient fault indicator signal indicates that the transient fault conditions have not occurred; and
   a constant current source having a first terminal connected to the input terminal of the low dropout voltage regulator and a second terminal connected to the output terminal of the transient fault sense circuit.

7. The low dropout voltage regulator of claim 6 wherein the local control loop comprises:
   a second transistor of the first conductivity type having a gate connected to the input terminal of the local control loop to receive the transient fault indicator signal, a drain connected to output terminal of the differential amplifier, and
   a third transistor of first conductivity type having a drain connected to a drain of the second transistor of the first conductivity type, a source connected to a biasing current source of the differential amplifier, and a gate connected to receive a feedback voltage that is scaled from an output voltage level of the output terminal of the low dropout voltage regulator.

8. The low dropout voltage regulator of claim 7 wherein when a voltage transient occurs at the input terminal of the low dropout voltage regulator, the output of the differential amplifier decreases and the voltage at the source of the first transistor of the first conductivity type increases, the first transistor of the first conductivity type and the second transistor of the second conductivity type begin to conduct generating the transient fault indicator signal forcing the voltage at the gate of the second transistor of the first conductivity type to decrease dramatically as the second transistor of the second conductivity type begins to saturate causing the second transistor of the first conductivity type to conduct, and wherein the voltage difference between the feedback voltage level and the voltage level of the input terminal of the low dropout voltage regulator causes the third transistor of the first conductivity type to conduct causing the output voltage level of the error amplifier to be clamped close to its operating level and the low dropout voltage regulator can assume regulation without a large output voltage overshoot.

9. A low dropout voltage regulator circuit comprising:
   a local control loop connected to provide a balancing current to an active load of a differential amplifier within a low dropout voltage regulator to clamp an output voltage level of the differential amplifier near an operational voltage level to insure fast response in controlling the gate of a pass transistor to minimize overshoot when a transient fault condition at the input terminal or the output terminal of the low dropout voltage regulator is ending and the voltage level present at the input terminal or output current level present at the output terminal is returned to its normal operating conditions.

10. The low dropout voltage regulator of claim 9 wherein the local control loop comprises:
   a clamping transistor of a first conductivity type having a source connected to a driver circuit of the low dropout voltage regulator and a drain connected to an output of the differential amplifier of the low dropout voltage regulator to provide the balancing current to the active load of the differential amplifier such that an output voltage at an output terminal of the differential amplifier is at approximately at the operating voltage level of the differential amplifier;
   a diode connected transistor of the first conductivity type having a source connected to a pass supply voltage source, a gate and drain connected to a gate of the clamping transistor; and
   a biasing transistor of a second conductivity type having a drain connected to a drain of the diode connected transistor and the gate of the clamping transistor, a gate connected to receive a biasing voltage level, and a source connected to ground reference voltage source;
   wherein a voltage developed by the diode connected transistor and the biasing transistor at the gate of the clamping transistor is less than the voltage level at the source of the clamping transistor and when the pass supply voltage source has a transient voltage, the clamping transistor is turned on to provide the balancing current to the active load of the differential amplifier to set output voltage at an output terminal of the differential amplifier is at approximately at the operating voltage level of the differential amplifier to quickly control a gate of a pass transistor of the low dropout regulator to minimize an overshoot of an output voltage of the low dropout voltage regulator.

11. A method for overshoot reduction for minimizing or eliminating an overshoot at an output terminal of a low dropout voltage regulator resulting from a transient fault conditions applied to an input terminal or output terminal of the low dropout voltage regulator, comprising the steps of:

activating the low dropout voltage regulator;

monitoring an input voltage at the input terminal or a current at the output terminal of the low dropout voltage regulator to sense if there is a transient fault condition;

providing a Miller capacitance at the output terminal of the differential amplifier of the low dropout voltage regulator to prevent the output of the differential amplifier from being discharged to ground;

when the transient fault condition is present at the input terminal or output terminal of the low dropout voltage regulator, balancing a current within an active load of a differential amplifier of an error amplifier of the low dropout voltage regulator to clamp the output of the differential amplifier to its normal operating point;

when the transient fault condition ends, setting the output voltage of the error amplifier such that a pass transistor of the low dropout regulator responds quickly to resume the regulation and the overshoot is reduced or eliminated;

sensing of the input voltage level and the output current level for the presence of the transient fault conditions; and disabling the current balancing when the transient fault conditions are not present.

* * * * *